(12) United States Patent
Huang

(10) Patent No.: US 8,487,694 B2
(45) Date of Patent: *Jul. 16, 2013

(54) CHARGE DOMAIN FILTER APPARATUS

(71) Applicant: Industrial Technology Research Institute, Hsinchu (TW)

(72) Inventor: Ming-Feng Huang, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/659,930

(22) Filed: Oct. 25, 2012

(65) Prior Publication Data

US 2013/0049850 A1    Feb. 28, 2013

Related U.S. Application Data

(62) Division of application No. 12/832,976, filed on Jul. 8, 2010, now Pat. No. 8,324,961.

(30) Foreign Application Priority Data

May 31, 2010    (TW) ............................. 99117432 A

(51) Int. Cl.
    *H03K 5/00*    (2006.01)
(52) U.S. Cl.
    USPC ............................ 327/554; 327/552; 327/362
(58) Field of Classification Search
    USPC ........................... 327/551–559, 336–337, 362
    See application file for complete search history.

(56) References Cited

U.S. PATENT DOCUMENTS

| | | | |
|---|---|---|---|
| 6,856,925 B2 | 2/2005 | Muhammad et al. | |
| 7,006,813 B2 | 2/2006 | Staszewski et al. | |
| 7,327,182 B2 | 2/2008 | Dosho et al. | |
| 7,535,288 B2 | 5/2009 | Iida | |
| 7,636,012 B2 | 12/2009 | Iida | |
| 7,965,135 B2 * | 6/2011 | Yoshizawa et al. | 327/554 |
| 8,067,972 B2 * | 11/2011 | Iida et al. | 327/337 |
| 8,279,023 B2 * | 10/2012 | Iida et al. | 333/174 |
| 8,324,961 B2 * | 12/2012 | Huang | 327/554 |
| 2008/0007326 A1 | 1/2008 | Iida | |
| 2008/0088389 A1 | 4/2008 | Iida | |
| 2009/0015306 A1 | 1/2009 | Yoshizawa et al. | |
| 2009/0021297 A1 | 1/2009 | Yoshizawa et al. | |
| 2009/0134916 A1 | 5/2009 | Iida et al. | |

(Continued)

OTHER PUBLICATIONS

D. Jakonis et al., A 2.4-GHz RF Sampling Receiver Front-End in 0.18-μm CMOS, IEEE Journal of Solid-State Circuits. vol. 40, No. 6, Jun. 2005, p. 1265-p. 1277.

(Continued)

*Primary Examiner* — Dinh T. Le
(74) *Attorney, Agent, or Firm* — Jianq Chyun IP Office

(57) ABSTRACT

A charge domain filter (CDF) apparatus having a bandwidth compensation circuit is provided. The bandwidth compensation circuit includes a configurable power-reference cell (CPC) and/or a programmable-delay cell (PDC). The CPC receives and adjusts an output of the CDF to obtain a sensing power, and outputs the sensing power to the CDF. The PDC receives and delay an output of the CDF, and outputs a delay result to the CDF. The bandwidth compensation circuit having a flexible structure, so as to implement X-axis (frequency) compensation and/or Y-axis (power or gain) compensation of a frequency response diagram according to a design requirement.

15 Claims, 30 Drawing Sheets

U.S. PATENT DOCUMENTS

2009/0134938 A1    5/2009    Iida et al.
2009/0160577 A1    6/2009    Yoshizawa et al.
2009/0161801 A1    6/2009    Huang et al.

OTHER PUBLICATIONS

C. Park et al. Non-Decimation FIR Filter for Digital RF Sampling Receiver with Wideband Operation Capability, 2009 IEEEA Radio Frequency Integrated Circuits Symposium, Jun. 7-9, 2009, p. 487-p. 490.

A. Yoshizawa et al., An Equalized Ultra-Wideband Channel-Select Filter with a Discrete-Time Charge-Domain Band-Pass IIR Filter, IEEE 2007 Custom Integrated Circuits Conference (CICC), Sep. 16-19, 2007, p. 707-p. 710.

A. Yoshizawa et al., A Gain-Bossted Discrete-Time Charge-Domain FIR LPF with Double-Complementary MOS Parametric Amplifiers, 2008 IEEE International Solid-State Circuits Conference, Feb. 3-7, 2008, p. 68-69, 596.

M.-F. Huang et al., A Quadrature Charge-Domain Filter with Frequency Down-Conversion and Filtering for RF Receivers, 2009 IEEE Radio Frequency Integrated Circuits Symposium, Jun. 7-9, 2009, p. 547-p. 550.

M.-F. Huang et al., a Discrete-Time AAF with Clock-Efficient Charge-Domain Filter for High Attenuation and Bandwidth, IEEE Asian Solid-State Circuits Conference Nov. 16-18, 2009, Taipei, Taiwan, p. 41-p. 44.

* cited by examiner

US 8,487,694 B2

CHARGE DOMAIN FILTER APPARATUS

CROSS-REFERENCE TO RELATED APPLICATION

This application is a divisional application of and claims priority benefit of an U.S. application Ser. No. 12/832,976, filed on Jul. 8, 2010, now pending, which claims the priority benefit of Taiwan application serial no. 99117432, filed May 31, 2010. The entirety of the above-mentioned patent application is hereby incorporated by reference herein and made a part of specification.

1. TECHNICAL FIELD

The disclosure relates to a filter. More particularly, the disclosure relates to a charge-domain filter (CDF) apparatus having a bandwidth compensation circuit.

2. BACKGROUND

A switch-capacitor network is a commonly used circuit for discrete time signal processing, which includes a plurality of switches and a plurality of capacitors. By turning on/off these switches, a user may control charge storage status of these capacitors, so as to process an input signal.

The switch-capacitor network is commonly used in a filter technique. Compared to a capacitor-resistor analog filter circuit, a filtering effect of the switch-capacitor network is mainly determined by size ratios of areas of the capacitors therein. Even if the areas of the capacitors are changed due to a fabrication process variation, since the size ratios of the capacitors are not changed along with the fabrication process variation, the filtering effect of the switch-capacitor network is unchanged. Therefore, the switch-capacitor networks are suitable for being fabricated within chips. Traditional CDF with the switch-capacitor network has narrow bandwidth because the traditional CDF does not use bandwidth compensation circuit.

SUMMARY

The disclosure is directed to a charge-domain filter (CDF) apparatus having a bandwidth compensation circuit for compensating a bandwidth and removing Sinc-function distortion.

The disclosure provides a charge-domain filter (CDF) apparatus. The CDF apparatus comprise an amplifier, a plurality of switch-capacitor network (SCN) sets and a bandwidth compensation circuit. The amplifier has a first input terminal receiving an input signal. The SCN sets has input terminals coupled to an output terminal of the amplifier, wherein output terminals of the SCN sets are connected to each other. The bandwidth compensation circuit has input terminal coupled to the output terminals of the SCN sets, for performing power sensing to the output terminals of the SCN sets, and outputting a sensing result to a second input terminal of the amplifier.

According to the above descriptions, the disclosure provides a bandwidth compensation circuit having a flexible structure, so as to implement X-axis (frequency) compensation and Y-axis (power or gain) compensation of a frequency response diagram according to a design requirement. In some exemplary embodiments, the bandwidth compensation circuit uses the PDC to select a suitable delay amount, so as to delay the output of the CDF, and feedback the delay result to the CDF to implement the X-axis compensation (which is also referred to as a frequency equalizer). In some other exemplary embodiments, the bandwidth compensation circuit uses the CPC to receive and adjust the output of the CDF to obtain a sensing power, and outputs the sensing power to the CDF to implement the Y-axis compensation (which is also referred to as a power equalizer).

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
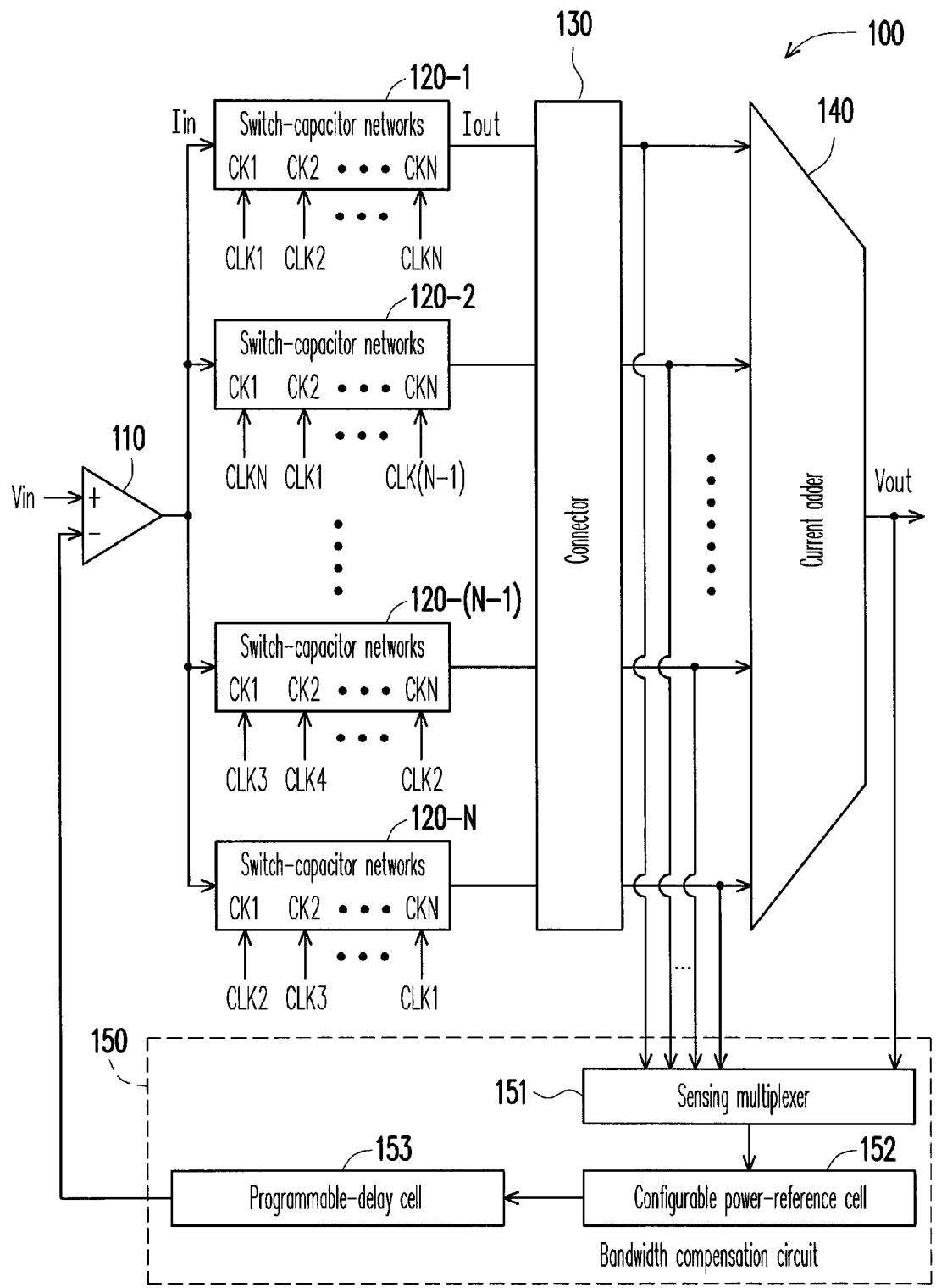
FIG. 1 is a functional block diagram of a charge-domain filter (CDF) apparatus according to an exemplary embodiment of the disclosure.

FIG. 1 is a functional block diagram of a charge-domain filter (CDF) apparatus according to an exemplary embodiment of the disclosure. The CDF apparatus includes a CDF 100 and a bandwidth compensation circuit 150. The CDF 100 includes an amplifier 110, a plurality of switch-capacitor networks (SCNs) 120-1~120-N, a connector 130 and a current adder (CA) 140. The amplifier 110 can be a transconductance amplifier (TA), or an operation amplifier (OP-AMP) or any circuit/device, etc. capable of performing a signal adding operation. A first input terminal (for example, a non-inverting input terminal) of the amplifier 110 receives an input signal Vin, and an output terminal of the amplifier 110 is connected to input terminals of the SCNs 120-1~120-N.

Any single-input single-output SCN or any single-input single-output CDF can be used to implement the SCNs 120-1~120-N, and the SCNs 120-1~120-N are unnecessarily to be all implemented by the same type of circuit. For example, the SCNs 120-1~120-N can be clock-efficient charge-domain filters (CECDFs). By designing different structures of the SCNs 120-1~120-N in the CDF 100, different filtering effects can be achieved.

In the present exemplary embodiment, a tap-length of the SCNs 120-1~120-N is N. Namely, the SCNs 120-1~120-N respectively have N clock input terminals CK1, CK2, . . . , and CKN for receiving clock signals CLK1, CLK2, . . . , and CLKN, wherein the clock signals CLK1-CLKN have different phases. Each of the SCNs 120-1~120-N receives the clock signals CLK1-CLKN according to a different sequence. For example, the clock input terminals CK1, CK2, . . . , and CKN of the SCN 120-1 respectively receive the clock signals CLK1, CLK2, . . . , and CLKN, and the clock input terminals CK1, CK2, CK3, . . . , and CKN of the SCN 120-2 respectively receive the clock signals CLKN, CLK1, CLK2, . . . , and CLK(N−1). Deduced by analogy, the clock input terminals CK1, CK2, . . . , CK(N−2), CK(N−1), and CKN of the SCN 120-(N−1) respectively receive the clock signals CLK3, CLK4, . . . , CLKN, CLK1, and CLK2, and the clock input terminals CK1, CK2, . . . , CK(N−1), and CKN of the SCN 120-N respectively receive the clock signals CLK2, CLK3, . . . , CLKN, and CLK1.

Figure 2:
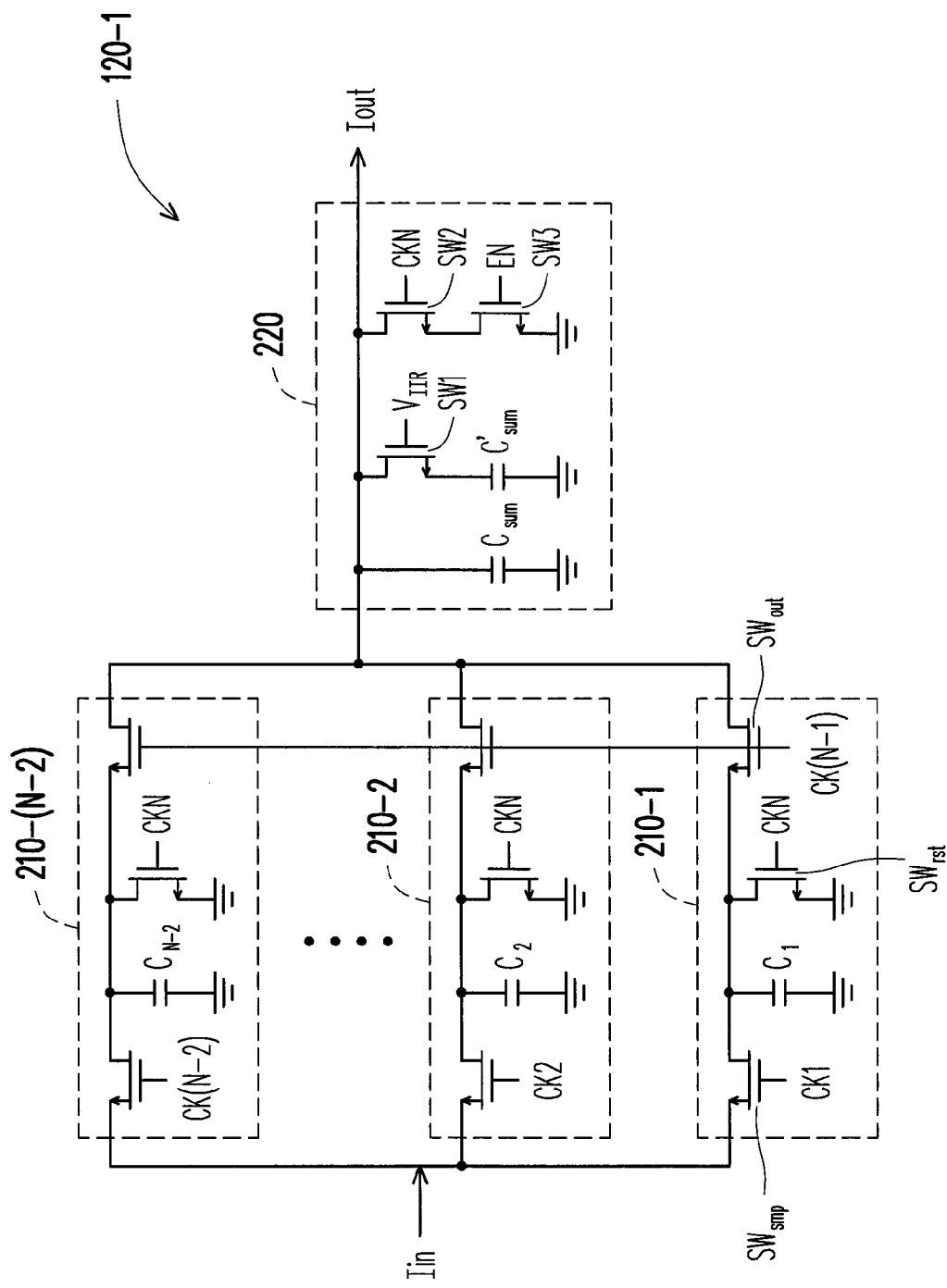
FIG. 2 is an example of a switch-capacitor network (SCN) 120-1 of FIG. 1.

For example, FIG. 2 is an example of the SCN 120-1 of FIG. 1. The related description of the SCN 120-1 can be referred for descriptions of the other SCNs 120-2~120-N. The SCN 120-1 includes a plurality of sampling units 210-1, 210-2, . . . , 210-(N−2) and a summation unit 220. Sampling terminals of the sampling units 210-1~210-(N−2) are connected to an input terminal Iin of the SCN 120-1. The sampling units 210-1~210-(N−2) respectively sample the input terminal Iin of the SCN 120-1 by different phases. An input terminal of the summation unit 220 is coupled to output terminals of the sampling units 210-1~210-(N−2) for summing sampling results of the sampling units 210-1~210-(N−2), and outputting a summing result to an output terminal Iout of the SCN 120-1.

An example of the sampling unit 210-1 is described below, and the related description of the sampling unit 210-1 and the content disclosed in FIG. 2 can be referred for descriptions of the other sampling units 210-2~210-(N−2). The sampling unit 210-1 includes a sampling switch SWsmp, a sampling capacitor $C_1$, a reset switch SWrst and an output switch SWout. A control end of the sampling switch SWsmp is coupled to the clock input terminal CK1 of the SCN 120-1. A first end of the sampling switch SWsmp serves as an input terminal of the sampling unit 210-1, and is coupled to the input terminal Iin of the SCN 120-1. A first end of the sampling capacitor $C_1$ is coupled to a second end of the sampling switch SWsmp. A first end of the reset switch SWrst is coupled to the first end of the sampling capacitor $C_1$. A second end of the reset switch SWrst and a second end of the sampling capacitor $C_1$ are coupled to a reference voltage (for example, a ground voltage). A control end of the reset switch SWrst is coupled to the clock input terminal CKN of the SCN 120-1. A control end of the output switch SWout is coupled to the clock input terminal CK(N−1) of the SCN 120-1. A first end of the output switch SWout is coupled to the first end of the sampling capacitor $C_1$, and a second end of the output switch SWout serves as an output terminal of the sampling unit 210-1, and is coupled to the input terminal of the summation unit 220.

Figure 3:
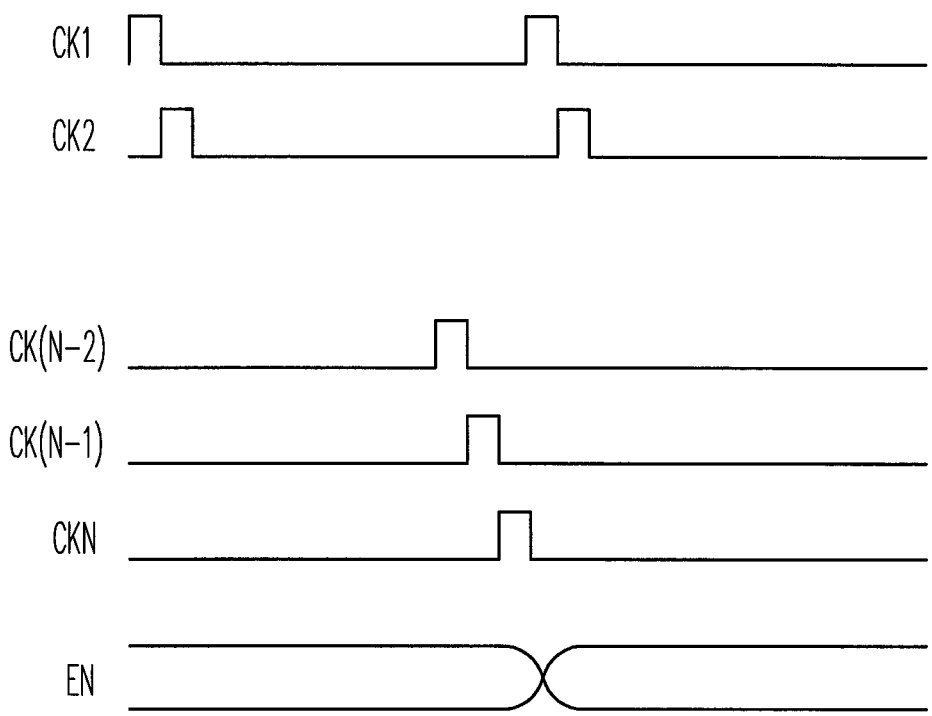
FIG. 3 is a timing diagram of signals of clock input terminals CK1-CKN of FIG. 2 and an enabling signal EN.

The control ends of the sampling switches of the sampling units 210-2~210-(N−2) are respectively coupled to the clock input terminals CK2-CK(N−2) of the SCN 120-1. FIG. 3 is a timing diagram of signals of the clock input terminals CK1-CKN of FIG. 2 and an enabling signal EN. Referring to FIG. 2 and FIG. 3, the sampling units 210-1~210-(N−2) sequentially and alternately sample the input terminal Iin of the SCN 120-1, and store the sampling results in the sampling capacitors $C_1, C_2, \ldots, C_{N-2}$. After the sampling operations of the sampling units 210-1~210-(N−2) are completed, signals of the clock input terminals CK(N−1) trigger the sampling units 210-1~210-(N−2) to respectively output the sampling result to the summation unit 220. After the sampling units 210-1~210-(N−2) respectively output their sampling results to the summation unit 220, signals of the clock input terminals CKN trigger the sampling units 210-1~210-(N−2) to respectively reset the sampling result to a certain initial value (for example, 0 volt).

As shown in FIG. 2, the summation unit 220 includes a summation capacitor $C_{sum}$, a first switch SW1, a first capacitor $C'_{sum}$, a second switch SW2 and a third switch SW3. A first end of the summation capacitor $C_{sum}$ is coupled to the output terminals of the sampling units 210-1~210-(N−2). When the output switches SWout of the sampling units 210-1~210-(N−2) are turned on, the summation capacitor $C_{sum}$ sums the sampling results of the sampling units 210-1~210-(N−2).

A first end of the first switch SW1 is coupled to the output terminals of the sampling units 210-1~210-(N−2), and a control end of the first switch SW1 is controlled by a control signal $V_{IIR}$. A first end of the first capacitor $C'_{sum}$ is coupled to a second end of the first switch SW1, and a second end of the first capacitor $C'_{sum}$ is coupled to a reference voltage (for example, a ground voltage). The control signal $V_{IIR}$ controls a conducting state of the first switch SW1, so as to change an equivalent capacitance of the summation capacitor $C_{sum}$. As the equivalent capacitance of the summation capacitor $C_{sum}$ is changed, a required bandwidth is changed, so that the first switch SW1 and the first capacitor $C'_{sum}$ can also be referred to as a bandwidth programming circuit.

A first end of the second switch SW2 is coupled to the first end of the summation capacitor $C_{sum}$, and a control end of the second switch SW2 is coupled to the clock input terminal CKN of the SCN 120-1. A first end of the third switch SW3 is coupled to a second end of the second switch SW2, a second end of the third switch SW3 is coupled to a reference voltage (for example, the ground voltage), and a control end of the third switch SW3 is controlled by the enabling signal EN.

The SCN 120-1 can be programmed as an infinite impulse response (IIR) filter or a finite impulse response (FIR) filter according to a state of the enabling signal EN. If the enabling signal EN has a low level in allusion to a narrow band, a reset operation performed to the summation capacitor $C_{sum}$ by the second switch SW2 is disabled, so that before a next summation period, charges in the capacitors $C_{sum}$ and $C'_{sum}$ are maintained. Namely, when the enabling signal EN has the low level, the SCN 120-1 can be regarded as the IIR filter. A transfer function of the IIR filter in a z-domain is as follows.

$$H_{IIR}(z) = \frac{\left(\dfrac{\sum_{i=1}^{N-2} C_{(N-1-i)} z^{-(i-1)}}{C_{sum} + \sum_{i=1}^{N-2} C_i}\right)}{\left(1 - \dfrac{C_{sum} z^{-(N-1)}}{C_{sum} + \sum_{i=1}^{N-2} C_i}\right)} \quad (1)$$

If the enabling signal EN has a high level in allusion to a wide band, the reset operation performed to the summation capacitor $C_{sum}$ by the second switch SW2 is enabled, so that before the next summation period, charges in the capacitors $C_{sum}$ and $C'_{sum}$ are abandoned. Namely, when the enabling signal EN has the high level, the SCN 120-1 can be regarded as the FIR filter. A transfer function of the FIR filter in a z-domain is as follows.

$$H_{FIR}(z) = \left( \frac{\sum_{i=1}^{N-2} C_{(N-1-i)} z^{-(i-1)}}{C_{sum} + \sum_{i=1}^{N-2} C_i} \right) \quad (2)$$

Therefore, the second switch SW2 and the third switch SW3 can be referred to as a FIR/IIR filter selection circuit. Moreover, according to the transfer function (1), the control signal $V_{IIR}$ controls a resistance of the first switch SW1 to change the charges stored in the first capacitor $C'_{sum}$, so as to effectively change the equivalent capacitance of the summation capacitor $C_{sum}$, and accordingly adjust a frequency response of the IIR filter. According to the transfer functions (1) and (2), a signal bandwidth can be programmed. Those skilled in the art can omit the FIR/IIR filter selection circuit (i.e. the switches SW2 and SW3) and/or the bandwidth programming circuit (i.e. the switch SW1 and the first capacitor $C'_{sum}$) according to an actual design requirement. A filtered output signal (a signal output by the output terminal Iout of the SCN 120-1) is down-converted to a base band.

Referring to FIG. 1, the connector 130 is coupled between the output terminals of the SCNs 120-1~120-N and input terminals of the CA 140. The connector 130 configures coupling status of the output terminals of the SCNs 120-1~120-N and the input terminals of the CA 140. For example, in some exemplary embodiment, the connector 130 directly connects the output terminal of each of the SCNs 120-1~120-N to one of the input terminals of the CA 140 by a one-to-one manner. In some other exemplary embodiments, the connector 130 probably shorts the output terminals of all of the SCNs 120-1~120-N, and connects the output terminals of the SCNs 120-1~120-N to the input terminals of the CA 140. The connector 130 can be coupled to the output terminals of the SCNs 120-1~120-N through various coupling approaches.

Namely, according to a design requirement, the connector 130 can be a wire combination having a fixed coupling configuration, or the connector 130 can be implemented by a configurable connector. The configurable connector can be controlled by an external digital controller to dynamically configure the coupling status of the output terminals of the SCNs 120-1~120-N and the input terminals of the CA 140. The connector 130 may include a plurality of electronic devices, circuits, or wires for directly or indirectly coupling the output terminals of the SCNs 120-1~120-N and the input terminals of the CA 140, wherein different coupling status may result in different filtering effects.

Any circuit/device capable of performing a summation operation to corresponding currents of the charges can be used to implement the CA 140. The CA 140 performs the summation operation to the corresponding currents of the charges, and outputs a summing result to serve as an output signal Vout. The bandwidth compensation circuit 150 is coupled to the CDF 100. The bandwidth compensation circuit 150 performs power sensing to a portion of or all of the output terminals of the SCNs 120-1~120-N and the CA 140, and outputs a sensing result to a second input terminal (for example, an inverting input terminal) of the amplifier 110. Those skilled in the art can select suitable reference sources to the bandwidth compensation circuit 150 according to an actual design requirement, so that the bandwidth compensation circuit 150 can output the sensing result to the second input terminal of the amplifier 110 according to the reference sources.

Figure 4:
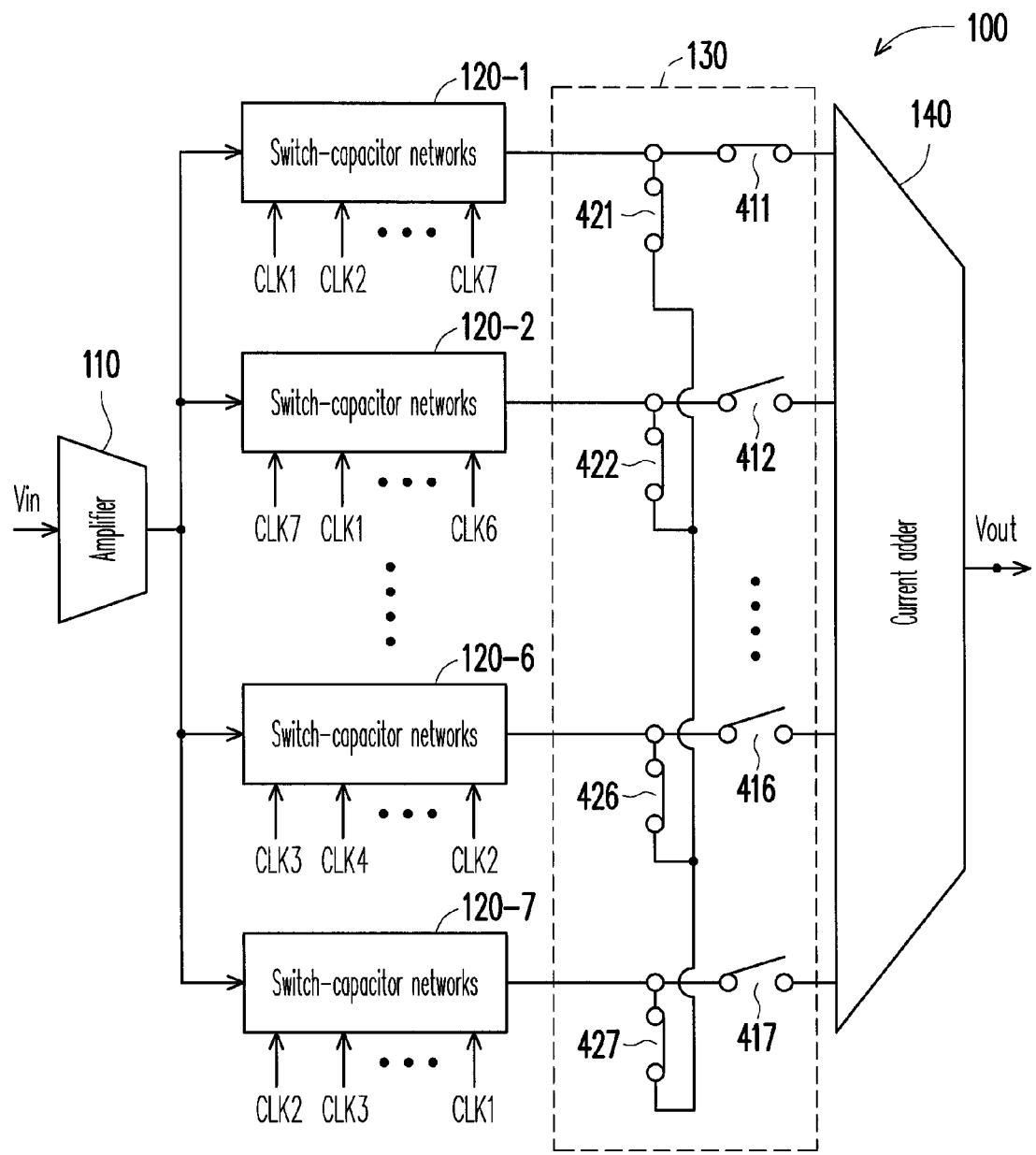
FIG. 4 is an example of a CDF of FIG. 1 in case that a tap-length N is 7.
Figure 5:
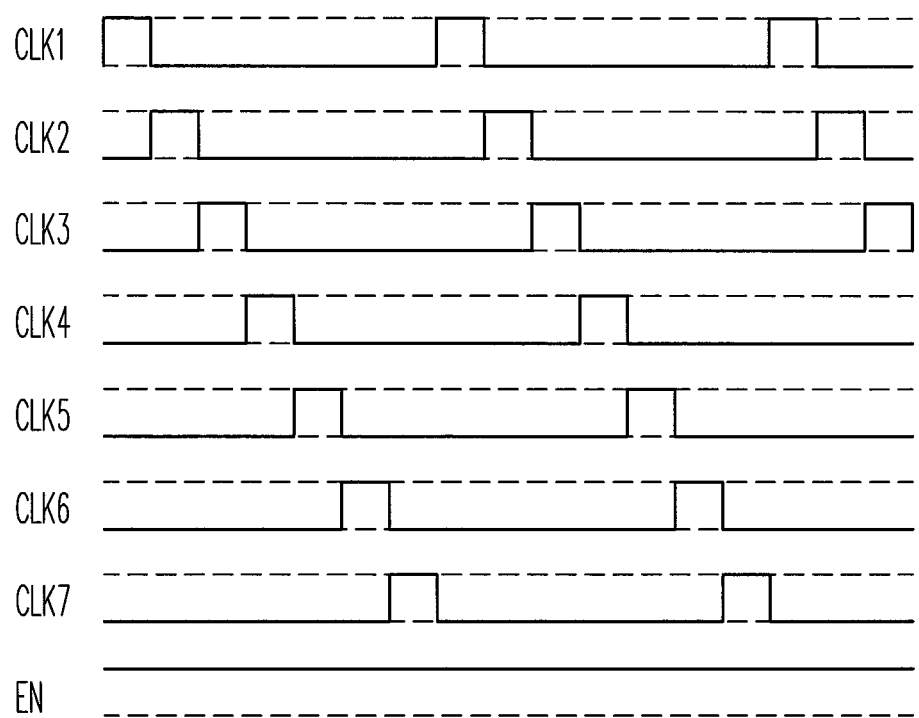
FIG. 5 is a timing diagram of signals of a circuit of FIG. 4.
Figure 6:
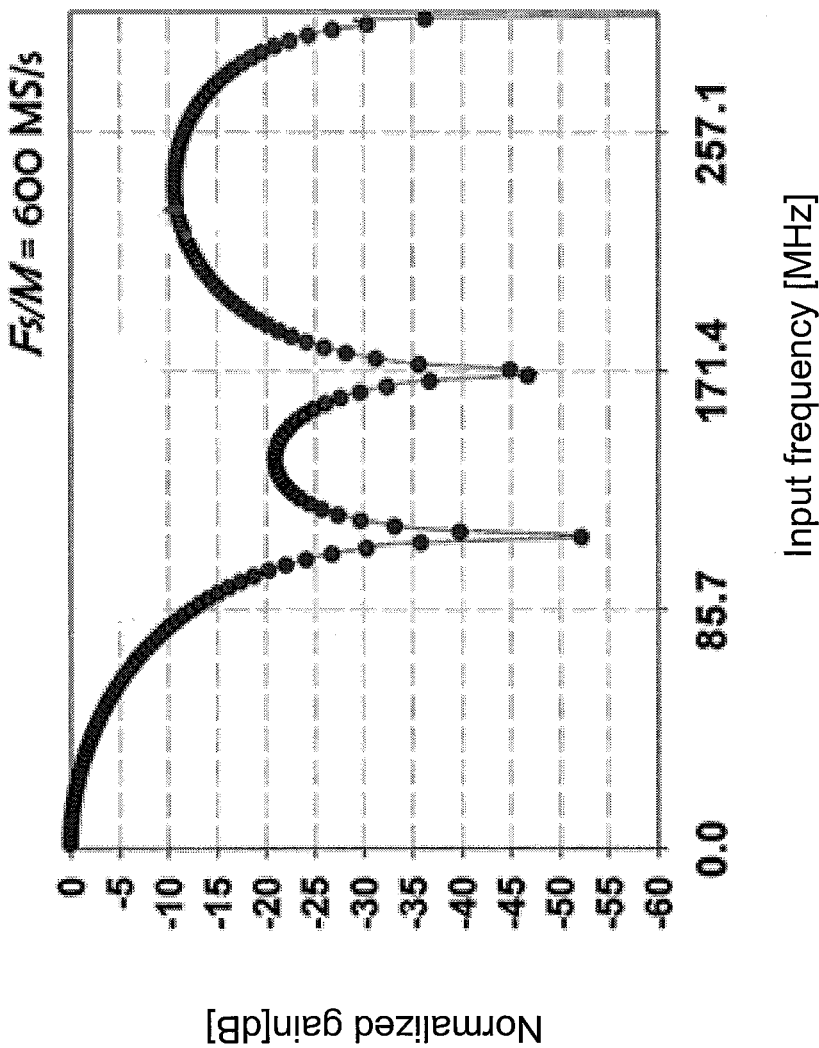
FIG. 6 is a frequency response diagram of an output function $H_{FIR}(z)$ of a CDF of FIG. 4.

FIG. 4 is an example of the CDF 100 of FIG. 1 in case that the tap-length N is 7. The amplifier 110 can be a transconductance amplifier. FIG. 5 is a timing diagram of the signals of the circuit of FIG. 4. In the present exemplary embodiment, switches 411, 412, . . . , 416 and 417 and switches 421, 422, . . . , 426 and 427 are used to implement the connector 130. When the switches 421-427 are all turned on, and at least one of the switches 411-417 is turned on, an output function of the CDF 100 in the z-domain is $H_{FIR}(z)=H_{SCN}(z)$, wherein $H_{SCN}(z)$ represents an output function of the SCNs 120-1~120-7. FIG. 6 is a frequency response diagram of the output function $H_{FIR}(z)$ of the CDF 100 of FIG. 4.

Figure 7:
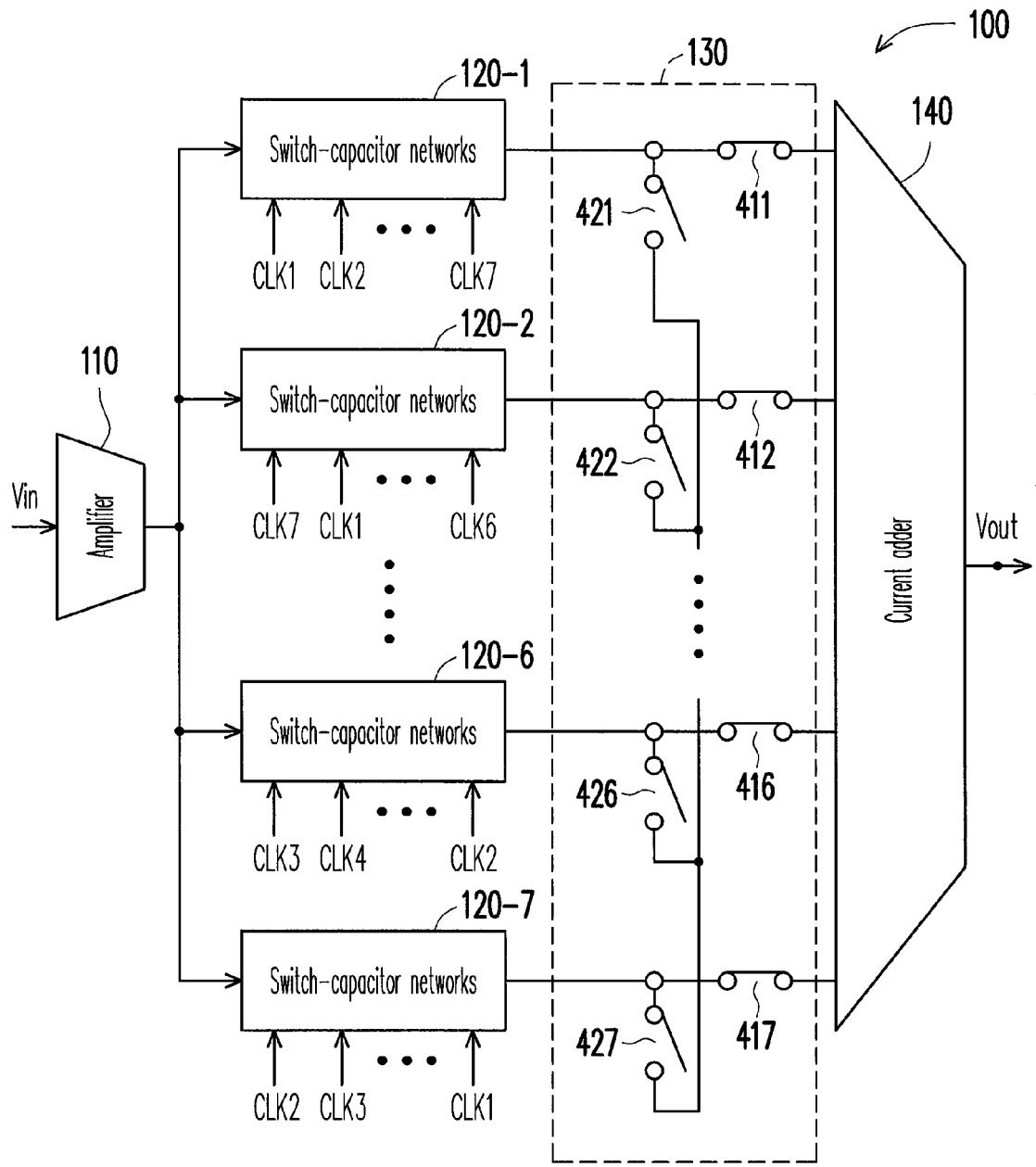
FIG. 7 is a schematic diagram illustrating another coupling status of a connector 130 of FIG. 4.
Figure 8:
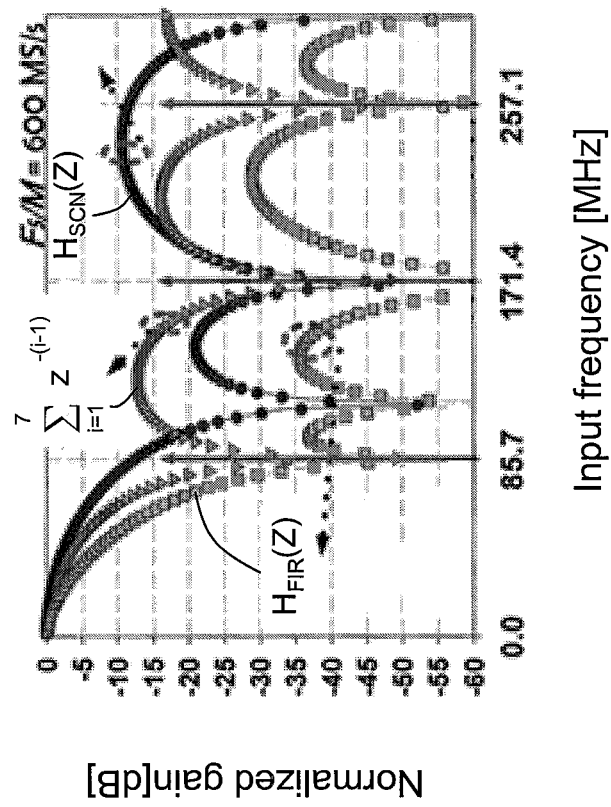
FIG. 8 is a frequency response diagram of an output function $H_{FIR}(z)$ of a CDF of FIG. 7.

FIG. 7 is a schematic diagram illustrating another coupling status of the connector 130 of FIG. 4. When the switches 411-417 are all turned on, and the switches 421-427 are all turned off, the output function of the CDF 100 in the z-domain is $$H_{FIR}(z) = H_{SCN}(z) \sum_{i=1}^{7} z^{-(i-1)},$$

wherein $H_{SCN}(z)$ represents an output function of the SCN 120-1, and $H_{SCN}(z)z^{-1}$ represents an output function of the SCN 120-2. Deduced by analogy, $H_{SCN}(z)z^{-5}$ represents an output function of the SCN 120-6, and $H_{SCN}(z)z^{-6}$ represents an output function of the SCN 120-7. FIG. 8 is a frequency response diagram of the output function $H_{FIR}(z)$ of the CDF 100 of FIG. 7.

Figure 9:
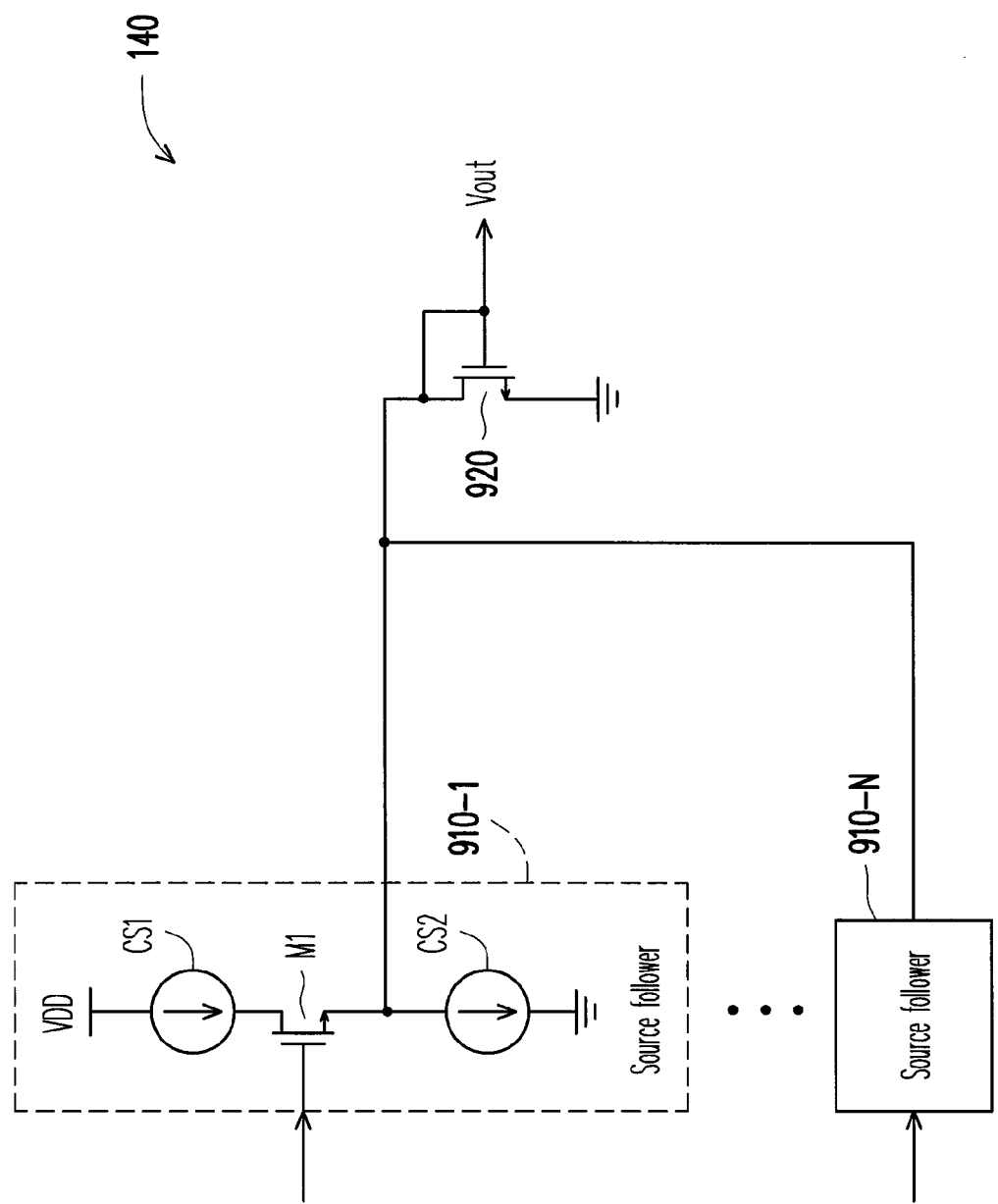
FIG. 9 is a circuit schematic diagram of a current adder (CA) 140 of FIG. 1 according to an exemplary embodiment of the disclosure.

FIG. 9 is a circuit schematic diagram of the CA 140 of FIG. 1 according to an exemplary embodiment of the disclosure. The CA 140 includes N source followers 910-1, . . . , 910-N and a current mirror transistor 920. Input terminals of the source followers 910-1~910-N respectively serve as the input terminal of the CA 140. A first end (for example, a drain) of the current mirror transistor 920 is connected to the output terminals of the source followers 910-1~910-N. A second end (for example, a source) of the current mirror transistor 920 is coupled to a reference voltage (for example, the ground voltage). A control end (for example, a gate) of the current mirror transistor 920 is coupled to the first end of the current mirror transistor 920. Therefore, the current mirror transistor 920 converts a total output current of the source followers 910-1~910-N into a corresponding voltage, and then outputs the corresponding voltage as the output signal Vout of the CDF 100. In other exemplary embodiments, the current mirror transistor 920 can be omitted, and the total output current of the source followers 910-1~910-N can be taken as the output signal Vout of the CDF 100.

An example of the source follower 910-1 is described with reference of FIG. 9. The related description of the source follower 910-1 can be referred for descriptions of the other source followers (for example, 910-N). Any type of the source follower can be used to implement the source followers 910-1~910-N, and the source followers 910-1~910-N are unnecessary to be all implemented by a same type of circuit. Different filtering effects can be achieved by designing different structures of the source followers 910-1~910-N within the CA 140. The source follower 910-1 includes a first current source CS1, a first transistor M1 and a second current source CS2. A first end of the first current source CS1 is coupled to a reference voltage (for example, a power voltage VDD), and a second end of the first current source CS1 is coupled to a first end (for example, a drain) of the first transistor M1. A control end (for example, a gate) of the first transistor M1 serves as an input terminal of the source follower 910-1. A first end of the second current source CS2 is coupled to a second end (for example, a source) of the first transistor M1, and a second end of the second current source CS2 is coupled to another reference voltage (for example, the ground voltage). Wherein, the second end of the first transistor M1 serves as an output terminal of the source follower 910-1.

Moreover, FIG. 1 illustrates the CDF 100 applying N clock signals (CLK1, CLK2, . . . , CLKN) and N sub-CDFs (SCNs 120-1~120-N). The SCNs 120-1~120-N decimate a sampling frequency Fa to a sampling frequency Fa/N. Since each of the SCNs 120-1~120-N receives the clock signals CLK1-CLKN in a different sequence, phases of output signals of the SCNs 120-1~120-N are mutually different. The CA 140 adds the N output signals having different phases, which is equivalent to an operation of increasing the sampling frequency Fa/N to the sampling frequency Fa. Therefore, the CDF 100 implements a non-decimation charge-domain filter (NDCDF) structure. A number of the SCNs can be determined according to an actual design requirement, for example, the number of the SCNs can be less then the number of the clock signals CLK1-CLKN, so that the CDF 100 may implement a decimation charge-domain filter (DCDF) structure.

Referring to FIG. 1, FIG. 1 illustrates an NDCDF structure having a 2-D bandwidth compensation function, which can reduce noise-folding and reduce current leakage of the SCNs, and remedy a Sinc-function distortion. The bandwidth compensation circuit 150 can be controlled by an external digital controller to provide a 2-D compensation of the bandwidth to the CDF 100. The bandwidth compensation circuit 150 includes a sensing multiplexer (SM) 151, a configurable power-reference cell (CPC) 152 and a programmable-delay cell (PDC) 153. A plurality of input terminals of the SM 151 is connected to the output terminals of the SCNs 120-1~120-N and the output terminal of the CA 140 through the connector 130. The SM 151 determines reference sources of the CDF 100 to the CPC 152.

An input terminal of the CPC 152 is connected to an output terminal of the SM 151. The SM 151 can output a portion of or all of the outputs of the SCNs 120-1~120-N and the CA 140 to the CPC 152, and the CPC 152 adjusts the output of the SM 151 to serve as at least one sensing power. The CPC 152 controls/adjusts a source power to achieve Y-axis compensation (power or gain compensation) of the frequency response diagram. Therefore, the CPC 152 can be referred to as a power equalizer.

An input terminal of the PDC 153 is coupled to the output terminal of the CPC 152. The PDC 153 delays the sensing power output by the CPC 152, and outputs the delayed sensing power as the sensing result of the bandwidth compensation circuit 150 to the second input terminal of the amplifier 110. The PDC 153 suitably delays the adjusted sensing power and feeds it back to the CDF 100, so as to achieve X-axis compensation (frequency compensation) of the frequency response diagram. The PDC 153 can be referred to as a frequency equalizer. Therefore, the bandwidth compensation circuit 150 has a 2-D compensation function.

The CDF 100 may provide a bandwidth programming to achieve the required bandwidth, and reduce a folding frequency to filter a clock feed-through of the SCNs 120-1~120-N, and accordingly mitigate a stop-band attenuation and remove the Sinc-function distortion. Moreover, even if the number of the SCNs is not equal to the number N of the clock signals, as long as a decimation method is used to perform time interleaving to increase the output sampling rate, such cascaded structure can still mitigate the stop-band attenuation.

Figure 10:
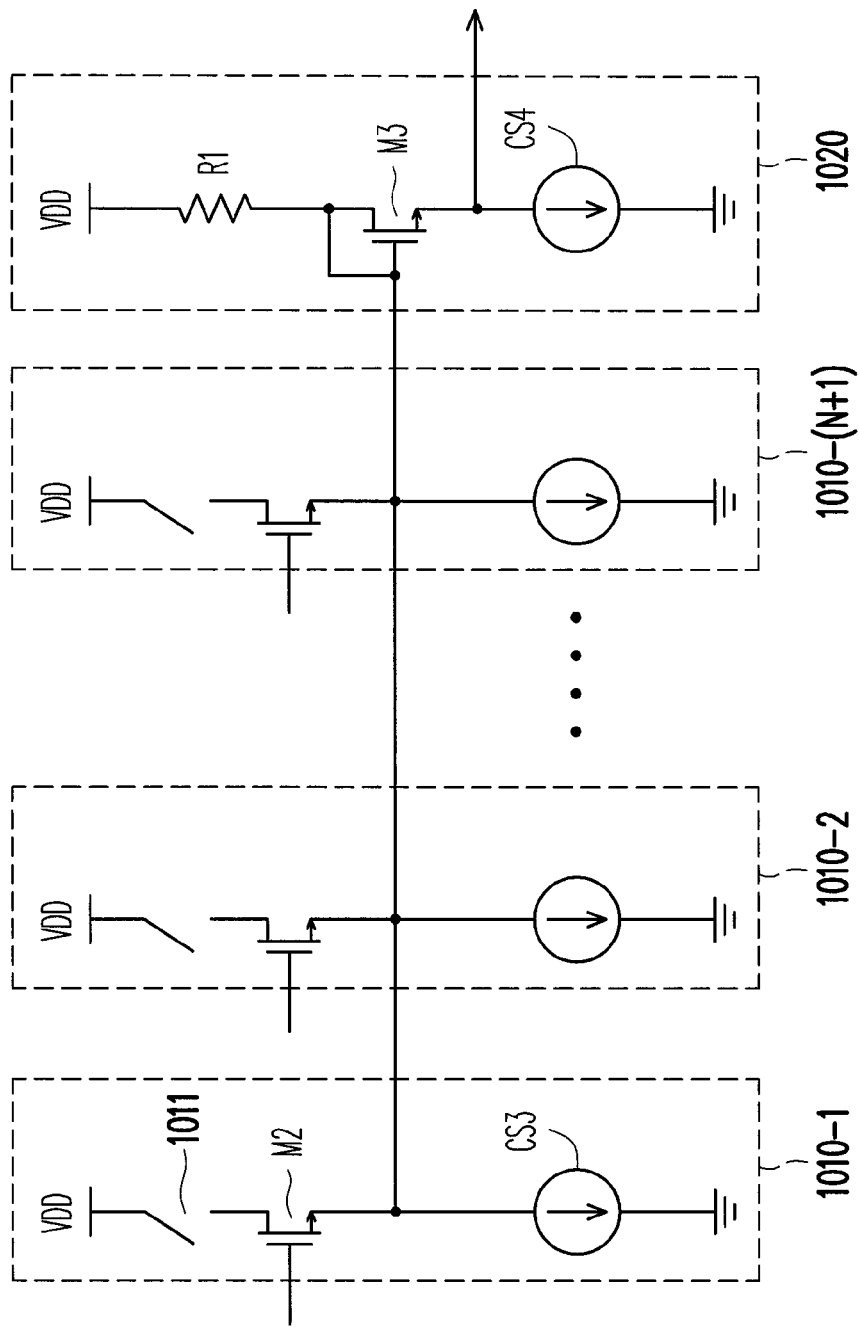
FIG. 10 is a circuit diagram of a sensing multiplexer (SM) according to an exemplary embodiment of the disclosure.

The SM 151 can by any type of multiplexer. For example, FIG. 10 is a circuit diagram of the SM 151 according to an exemplary embodiment of the disclosure. Referring to FIG. 10, the SM 151 includes input states 1010-1, 1010-2, . . . , 1010-(N+1) and an output stage 1020. The input stage 1010-1 is taken as an example for description, and related description of the input stage 1010-1 can be referred for descriptions of the other input stages 1010-2~1010-(N+1).

The input stage 1010-1 includes a second transistor M2, a third current source CS3 and a selection switch 1011. A control end (for example, a gate) of the second transistor M2 serves as the input terminal of the SM 151. A first end of the selection switch 1011 is coupled to a first reference voltage (for example, the power voltage VDD), and a second end of the selection switch 1011 is coupled to a first end (for example, a drain) of the second transistor M2. A second end (for example, a source) of the second transistor M2 is coupled to a first end of the third current source CS3. A second end of the current source CS3 is coupled to a second reference voltage (for example, the ground voltage). The second end of the second transistor M2 is further coupled to the output stage 1020.

The output stage 1020 includes a first resistor R1, a third transistor M3 and a fourth current source CS4. A first end of the first resistor R1 is coupled to the first reference voltage (for example, the power voltage VDD), and a second end of the first resistor R1 is coupled to a first end (for example, a drain) of the third transistor M3. A control end (for example, a gate) of the third transistor M3 is coupled to the second end of the second transistor (for example, M2) of each of the input stages 1010-2~1010-(N+1). The first end of the third transistor M3 is coupled to the control end of the third transistor M3. A second end (for example, a source) of the third transistor M3 serves as the output terminal of the SM 151. A first end of the fourth current source CS4 is coupled to the second end of the third transistor M3, and a second end of the fourth current source CS4 is coupled to the second reference voltage (for example, the ground voltage).

By controlling conducting states of the selection switches in internal of the input stages 1010-1~1010-(N+1), one or a plurality of reference sources (i.e. the output terminals of the SCNs 120-1~120-N and the output terminal of the CA 140) of the CDF 100 can be transmitted to the CPC 152 through the output stage 1020.

Figure 11:
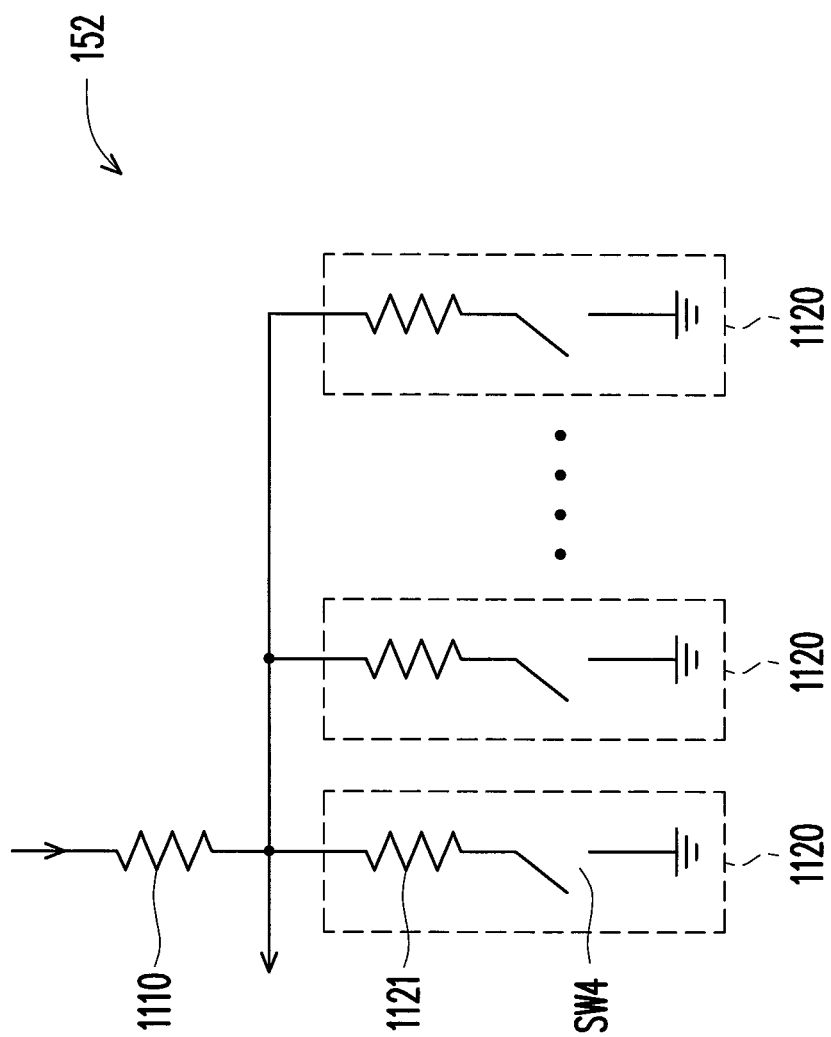
FIG. 11 is a circuit schematic diagram of a configurable power-reference cell (CPC) according to an exemplary embodiment of the disclosure.

FIG. 11 is a circuit schematic diagram of the CPC 152 according to an exemplary embodiment of the disclosure. Referring to FIG. 11, the CPC 152 includes an upper divider resistor 1110 and a plurality of lower divider resistor units 1120. A first end of the upper divider resistor 1110 serves as the input terminal of the CPC 152, and a second end of the upper divider resistor 1110 serves as the output terminal of the CPC 152. Each of the lower divider resistor unit 1120 includes a lower divider resistor 1121 and a fourth switch SW4. A first end of the lower divider resistor 1121 is coupled to the second end of the upper divider resistor 1110. A first end of the fourth switch SW4 is coupled to a second end of the lower divider resistor 1121, and a second end of the fourth switch SW4 is coupled to a reference voltage (for example, the ground voltage). By controlling a conducting state of each of the fourth switches SW4, a resistance ratio of the upper and the lower divider resistors can be determined, so as to adjust the power of the reference source to obtain the at least one sensing power. Then, the sensing power is transmitted to the PDC 153. Therefore, the CPC 152 controls/adjusts the sensing power (feedback signal) to achieve the Y-axis compensation (power or gain compensation) of the frequency response diagram.

Figure 12:
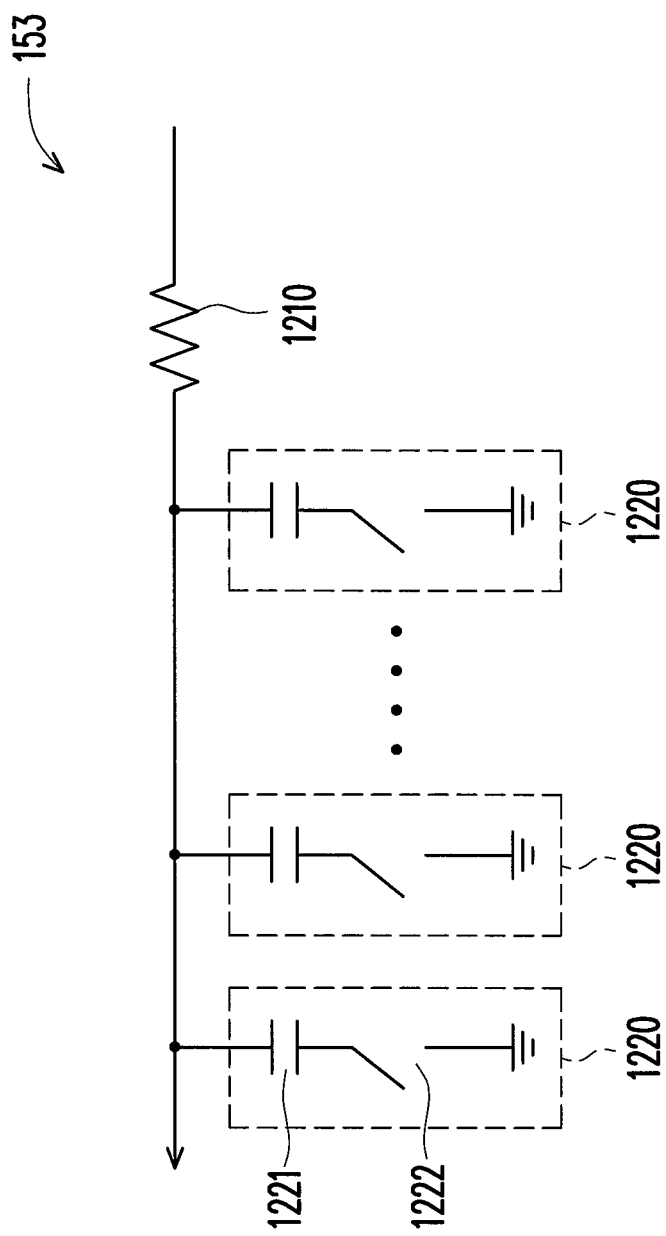
FIG. 12 is a circuit schematic diagram of a programmable-delay cell (PDC) according to an exemplary embodiment of the disclosure.

FIG. 12 is a circuit schematic diagram of the PDC 153 according to an exemplary embodiment of the disclosure. Referring to FIG. 12, the PDC 153 includes an equivalent reference resistor 1210 and a plurality of delay units 1220. The equivalent reference resistor 1210 has a resistance Rref. A first end of the equivalent reference resistor 1210 is coupled to the input terminal of the PDC 153, and a second end of the equivalent reference resistor 1210 is coupled to the output terminal of the PDC 153 and the delay units 1220. Each of the delay units 1220 includes a delay capacitor 1221 and a delay switch 1222. A first end of the delay capacitor 1221 is coupled to the second end of the equivalent reference resistor 1210 and the output terminal of the PDC 153. A first end of the delay switch 1222 is coupled to a second end of the delay capacitor 1221, and a second end of the delay switch 1222 is coupled to a reference voltage (for example, the ground voltage). By controlling a conducting state of each of the delay switches 1222 and the equivalent reference resistor 1210, a total time constant of the PDC 153 can be determined, so as to determine the delay time of the PDC 153. Therefore, the PDC 153 can suitably delay the adjusted sensing power (feedback signal) and feeds it back to the CDF 100, so as to achieve the X-axis compensation (frequency compensation) of the frequency response diagram.

Figure 13:
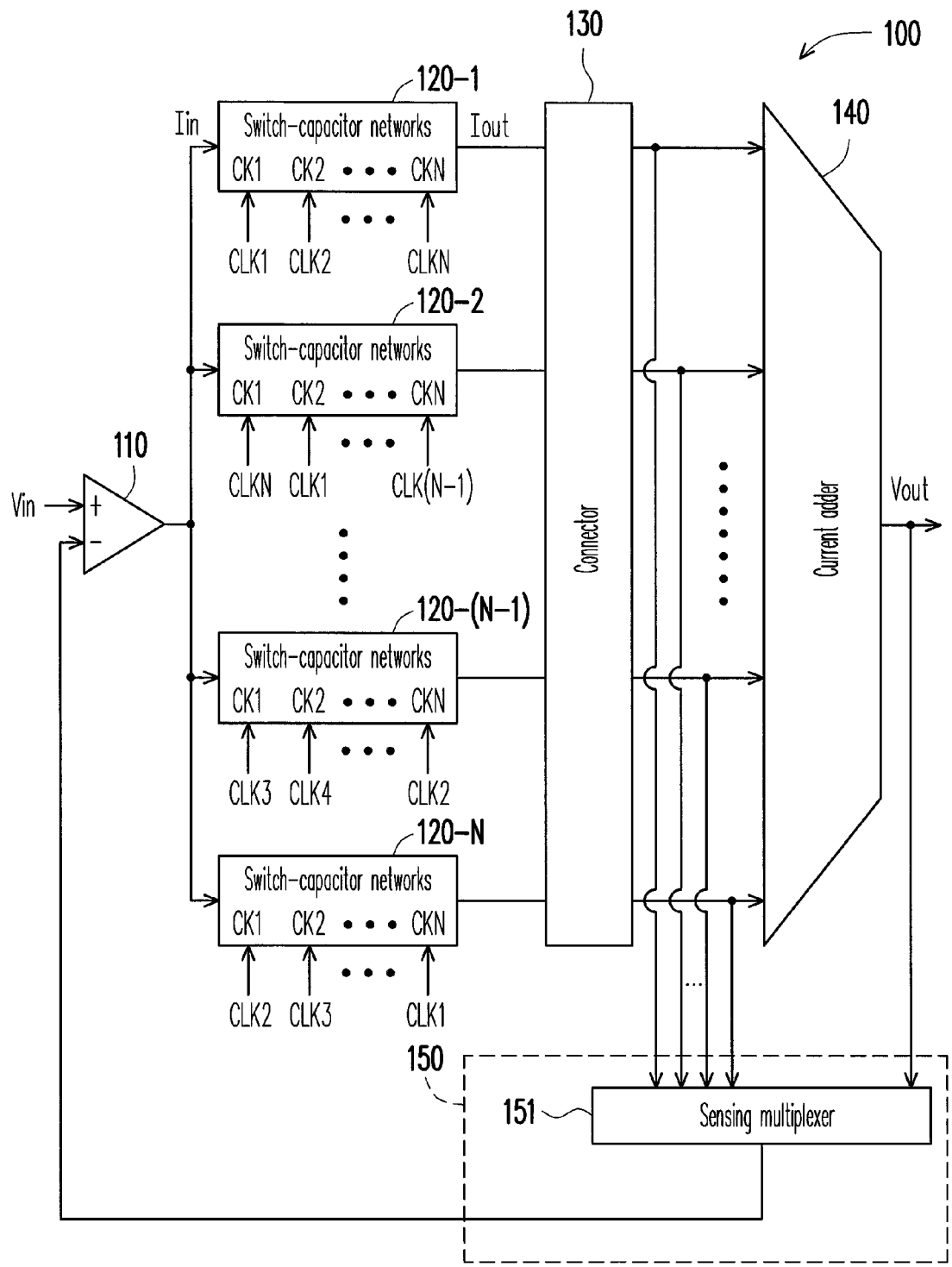
FIGS. 13-18, FIG. 21 and FIG. 24 are functional block diagrams of a bandwidth compensation circuit 150 of FIG. 1 according to other exemplary embodiments of the disclosure.

Implementations of the CPC 152 and the PDC 153 are not limited to the above descriptions, and the CPC 152 and the PDC 153 can be implemented by other methods according to an actual design requirement. For example, the SCNs (for example, the SCNs shown in FIG. 2 or other SCNs) can be used to implement the CPC 152 and the PDC 153. FIG. 13 is a circuit schematic diagram of the bandwidth compensation circuit 150 of FIG. 1 according to another exemplary embodiment of the disclosure.

Referring to FIG. 13, in the present exemplary embodiment, a wire is used to implement the CPC 152 and the PDC 153 of FIG. 1. A plurality of input terminals of the SM 151 is coupled to the output terminals of the SCNs 120-1~120-N and the output terminal of the CA 140. The SM 151 transmits a portion of or all of the outputs of the SCNs 120-1~120-N and the CA 140 to the second input terminal of the amplifier 110 through the wire. Namely, in case of a certain design consideration, the bandwidth compensation circuit 150 compensate the bandwidth of the CDF 100 by a fixed amount, and a programming mechanism is omitted.

Figure 14:
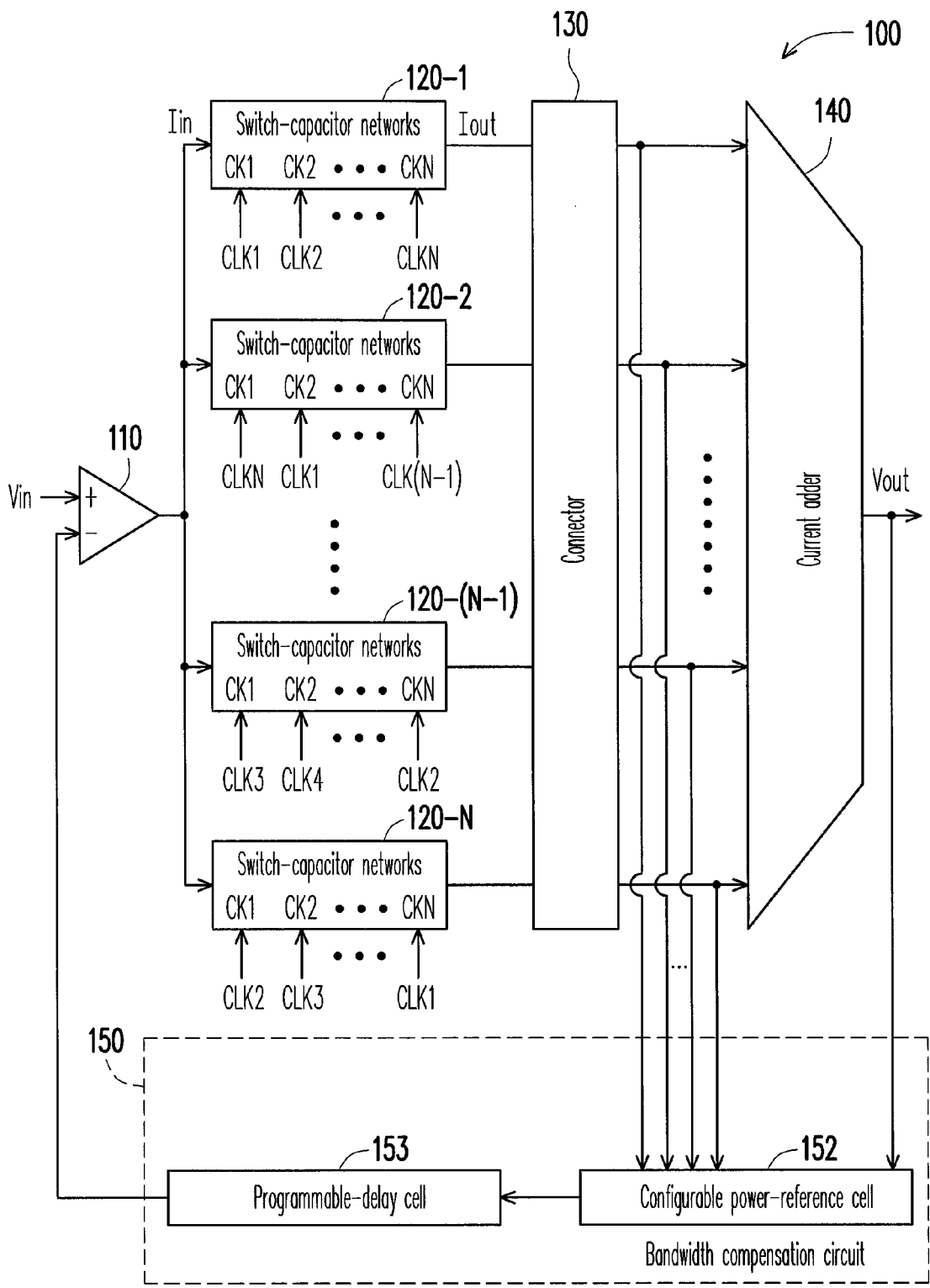

FIG. 14 is a functional block diagram of the bandwidth compensation circuit 150 of FIG. 1 according to still another exemplary embodiment of the disclosure. Referring to FIG. 14, in the present exemplary embodiment, the SM 151 of FIG. 1 is omitted. The input terminals of the CPC 152 are coupled to the output terminals of the SCNs 120-1~120-N and the output terminal of the CA 140. The output terminals of the SCNs 120-1~120-N and the output terminal of the CA 140 serve as the reference sources of the bandwidth compensation circuit 150. The CPC 152 can generate a corresponding sensing power to the PDC 153 according to a portion of or all of the reference sources. The CPC 152 can be implemented according to the aforementioned related methods. For example, a plurality sets of circuit shown in FIG. 11 can be used to implement the CPC 152. An input terminal of each set of the circuit shown in FIG. 11 is connected to one of the reference sources by a one-to-one manner. An output terminal of each set of the circuit shown in FIG. 11 is connected to the input terminal of the PDC 153. Moreover, a switch is configured to each input terminal of the CPC 152, so that the CPC 152 has a function of selecting the reference resources. Therefore, the bandwidth compensation circuit 150 of FIG. 14 also has the 2-D bandwidth compensation function.

Moreover, in some exemplary embodiments, the input terminals of the CPC 152 are probably coupled to only one of the output terminals of the SCNs 120-1~120-N, or only coupled to the output terminal of the CA 140.

Figure 15:
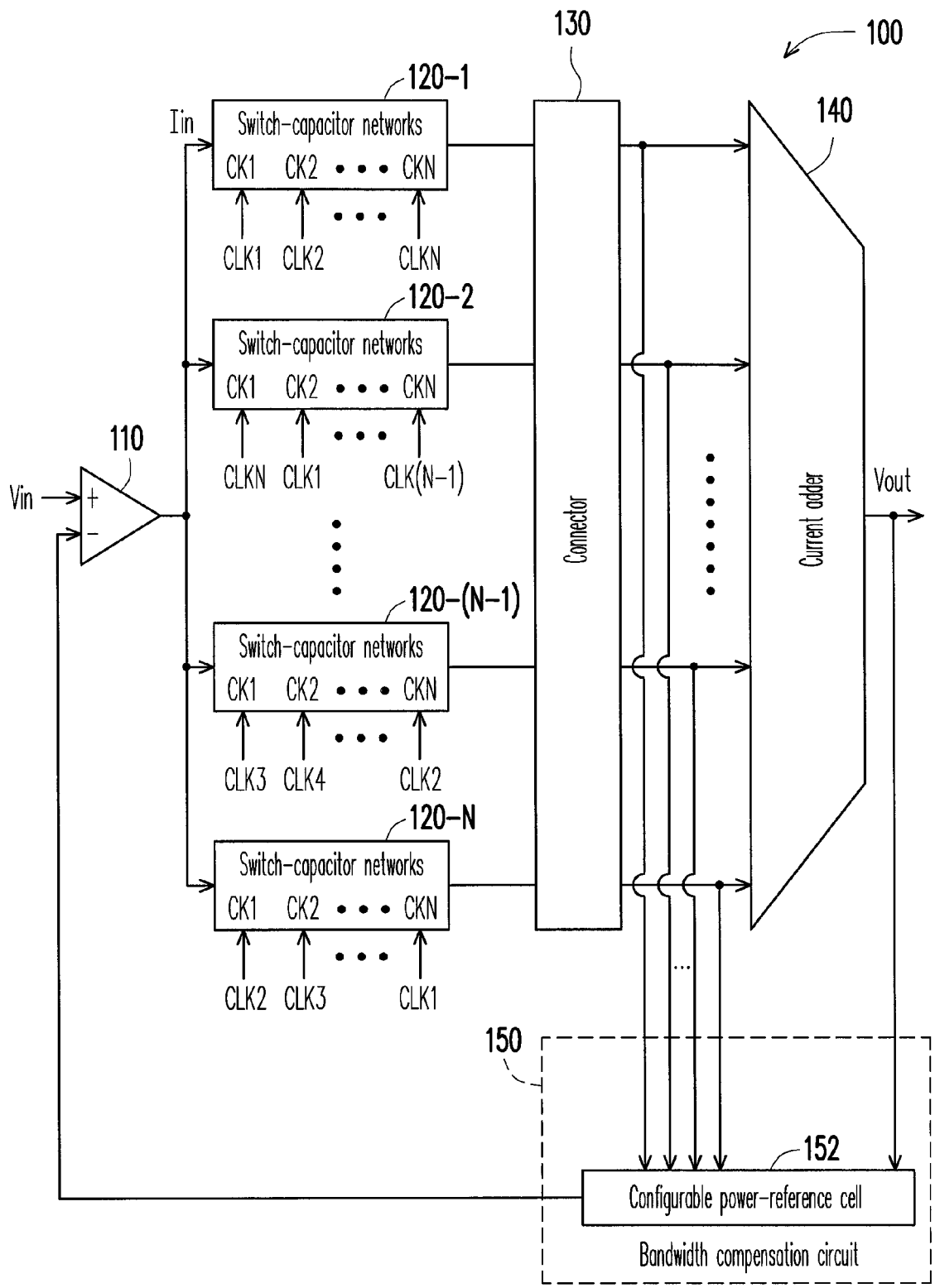

The CPC 152 or the PDC 153 shown in FIG. 14 can be further omitted according to an actual design requirement. For example, FIG. 15 is a functional block diagram of the bandwidth compensation circuit 150 of FIG. 1 according to yet another exemplary embodiment of the disclosure. The bandwidth compensation circuit 150 may include the CPC 152. The input terminals of the CPC 152 are coupled to the output terminals of the SCNs 120-1~120-N and the output terminal of the CA 140. The output terminal of the CPC 152 is coupled to the second input terminal of the amplifier 110. The CPC 152 adjusts a portion of or all of the outputs of the SCNs 120-1~120-N and the CA 140 to obtain at least one sensing power, and outputs the sensing power as a sensing result of the bandwidth compensation circuit 150 to the second input terminal of the amplifier 110. The related description of the bandwidth compensation circuit 150 of FIGS. 1-14 can be referred for implementation of the bandwidth compensation circuit 150 of FIG. 15.

Figure 16:
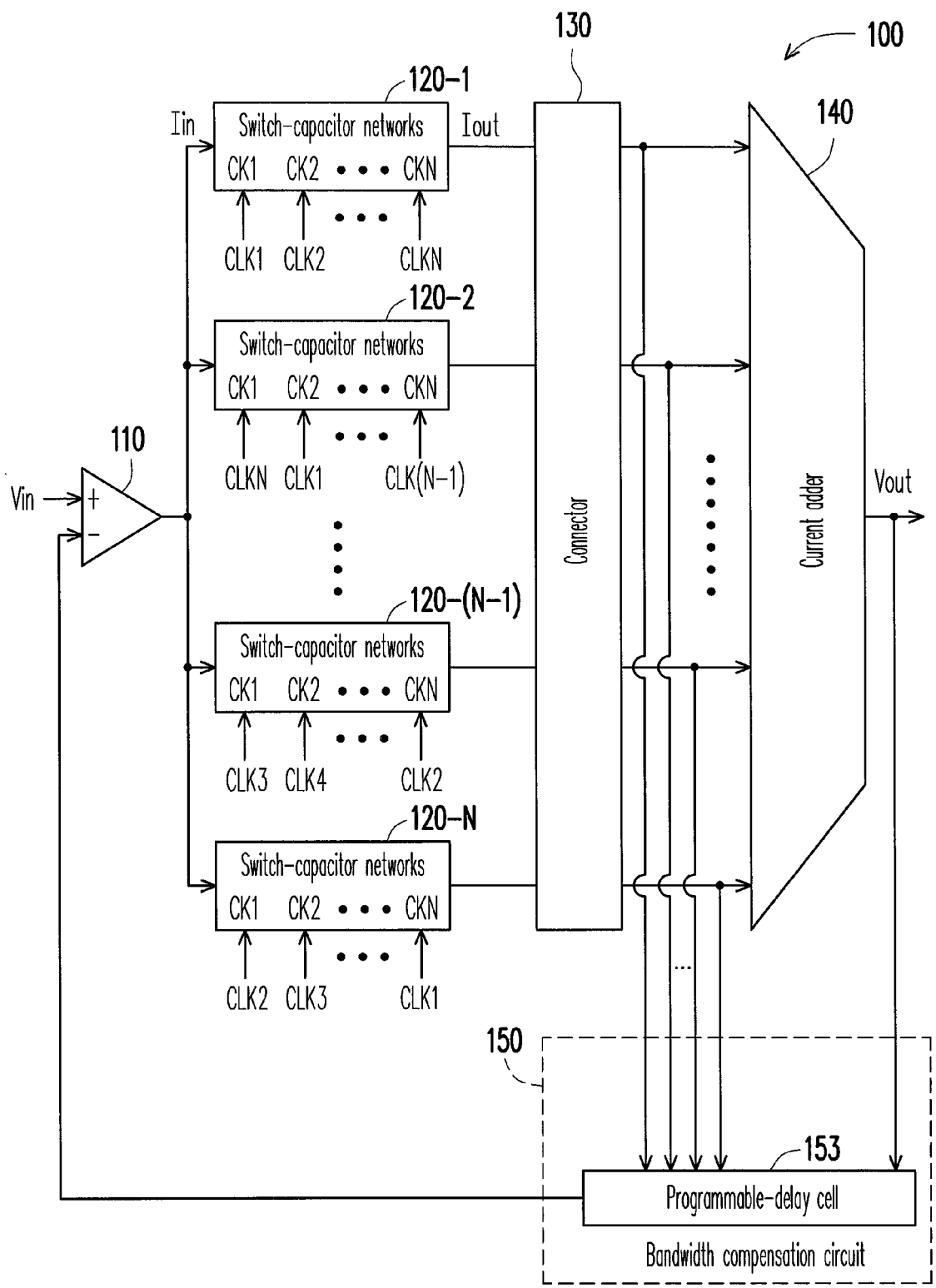

FIG. 16 is a functional block diagram of the bandwidth compensation circuit 150 of FIG. 1 according to yet another exemplary embodiment of the disclosure. The bandwidth compensation circuit 150 includes the PDC 153. The input terminals of the PDC 153 are coupled to the output terminals of the SCNs 120-1~120-N and the output terminal of the CA 140. A switch can be configured to each input terminal of the PDC 153, so that the PDC 153 may have a function of selecting the reference resources. The PDC 153 delays a portion of or all of the outputs of the SCNs 120-1~120-N and the CA 140, and outputs the delay result as the sensing result of the bandwidth compensation circuit 150 to the second input terminal of the amplifier 110. In some exemplary embodiments, the input terminals of the PDC 153 are probably coupled to only one of the output terminals of the SCNs 120-1~120-N, or only coupled to the output terminal of the CA 140. The related description of the bandwidth compensation circuit 150 of FIGS. 1-14 can be referred for implementation of the bandwidth compensation circuit 150 of FIG. 16.

Figure 17:
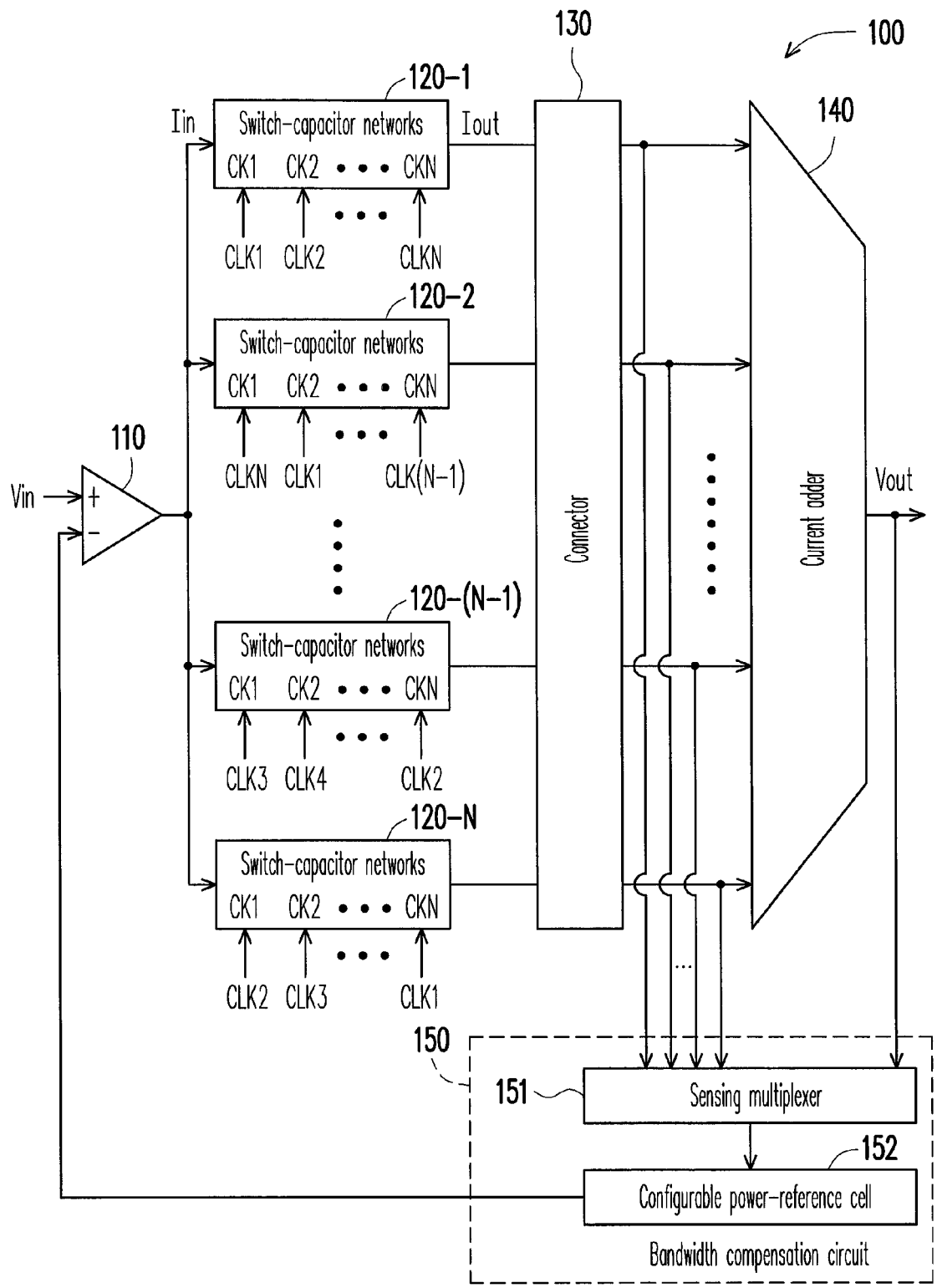

FIG. 17 is a functional block diagram of the bandwidth compensation circuit 150 of FIG. 1 according to yet another exemplary embodiment of the disclosure. Referring to FIG. 17, in the present exemplary embodiment, the PDC 153 shown in FIG. 1 is omitted. The input terminal of the CPC 152 is coupled to the output terminal of the SM 151, and the output terminal of the CPC 152 is coupled to the second input terminal of the amplifier 110. Therefore, the bandwidth compensation circuit 150 of FIG. 17 can achieve the Y-axis compensation (power or gain compensation) of the frequency response diagram.

Figure 18:
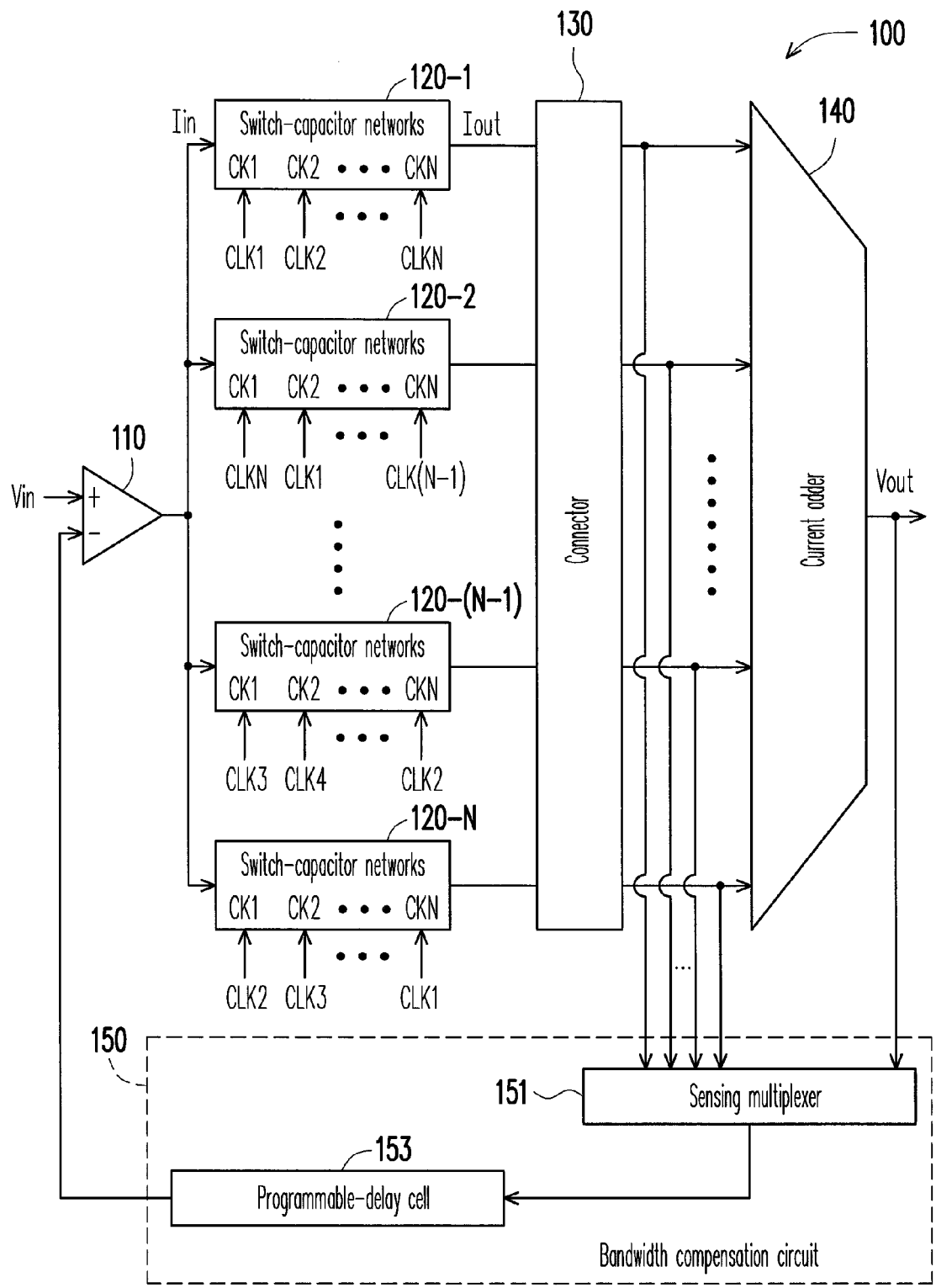

FIG. 18 is a functional block diagram of the bandwidth compensation circuit 150 of FIG. 1 according to yet another exemplary embodiment of the disclosure. Referring to FIG. 18, in the present exemplary embodiment, the CPC 152 shown in FIG. 1 is omitted. The output terminal of the SM 151 is coupled to the input terminal of the PDC 153. Therefore, the bandwidth compensation circuit 150 of FIG. 18 can achieve the X-axis compensation (frequency compensation) of the frequency response diagram.

Figure 19:
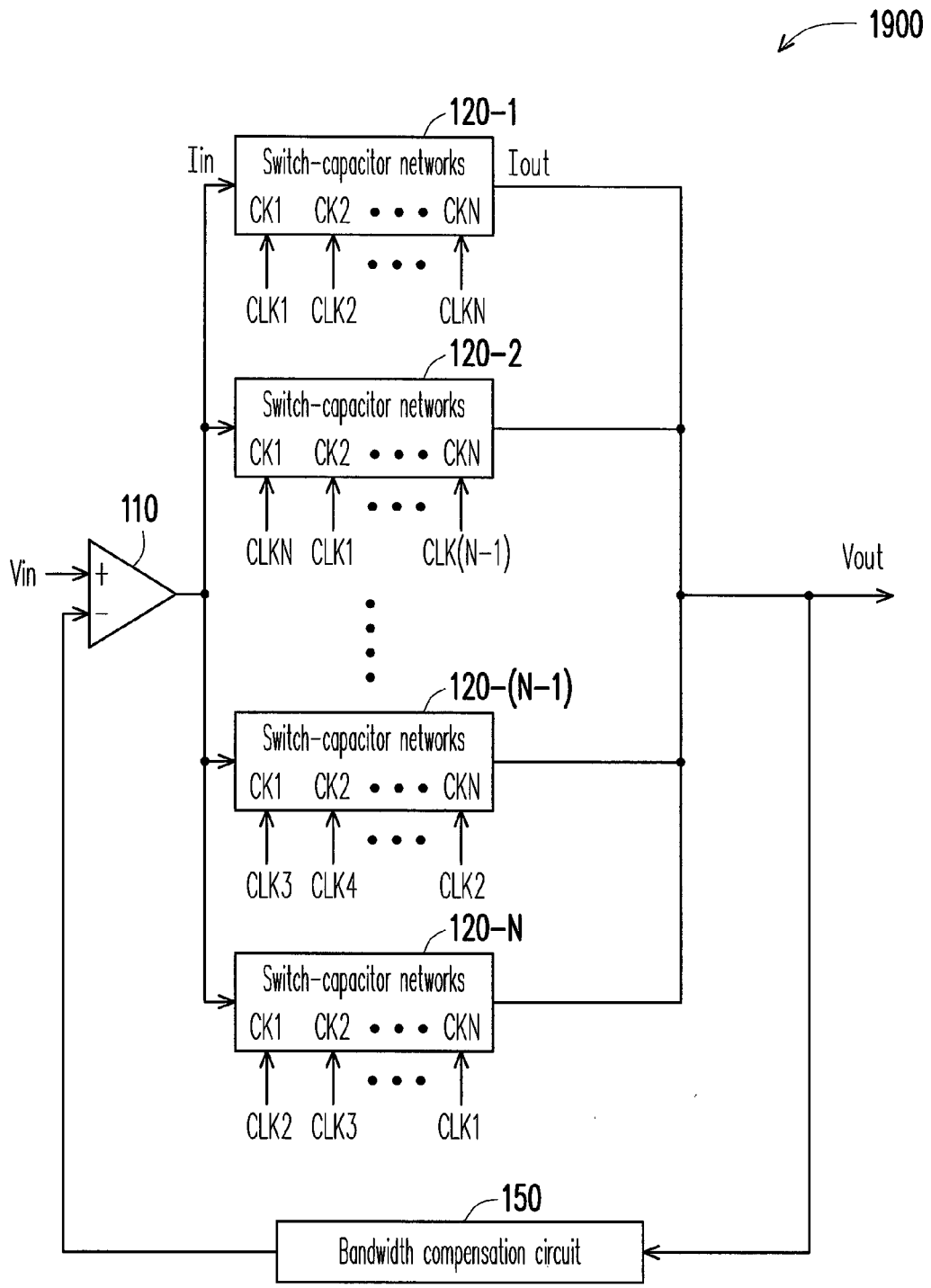
FIGS. 19-20 are functional block diagrams of a CDF according to other exemplary embodiments of the disclosure.

The aforementioned CDF 100 is only an application example of the bandwidth compensation circuit 150. The bandwidth compensation circuit 150 can also be applied to other types of CDF. For example, FIG. 19 is a functional block diagram of a CDF 1900 according to another exemplary embodiment of the disclosure. Compared to the CDF 100 of FIG. 1, the CDF 1900 does not include the CA 140. Related description of the CDF 100 can be referred for implementation of the CDF 1900. The related description of the bandwidth compensation circuit 150 of FIGS. 1-18 can be referred for implementing the bandwidth compensation circuit 150 of FIG. 19. Referring to FIG. 19, the output terminals of the SCNs 120-1~120-N are connected in parallel to provide the output signal Vout. The input terminal of the frequency compensation circuit 150 is connected to the output terminal of the CDF 1900 for receiving the output of the CDF 1900. The frequency compensation circuit 150 outputs the compensation result to the CDF 1900.

Figure 20:
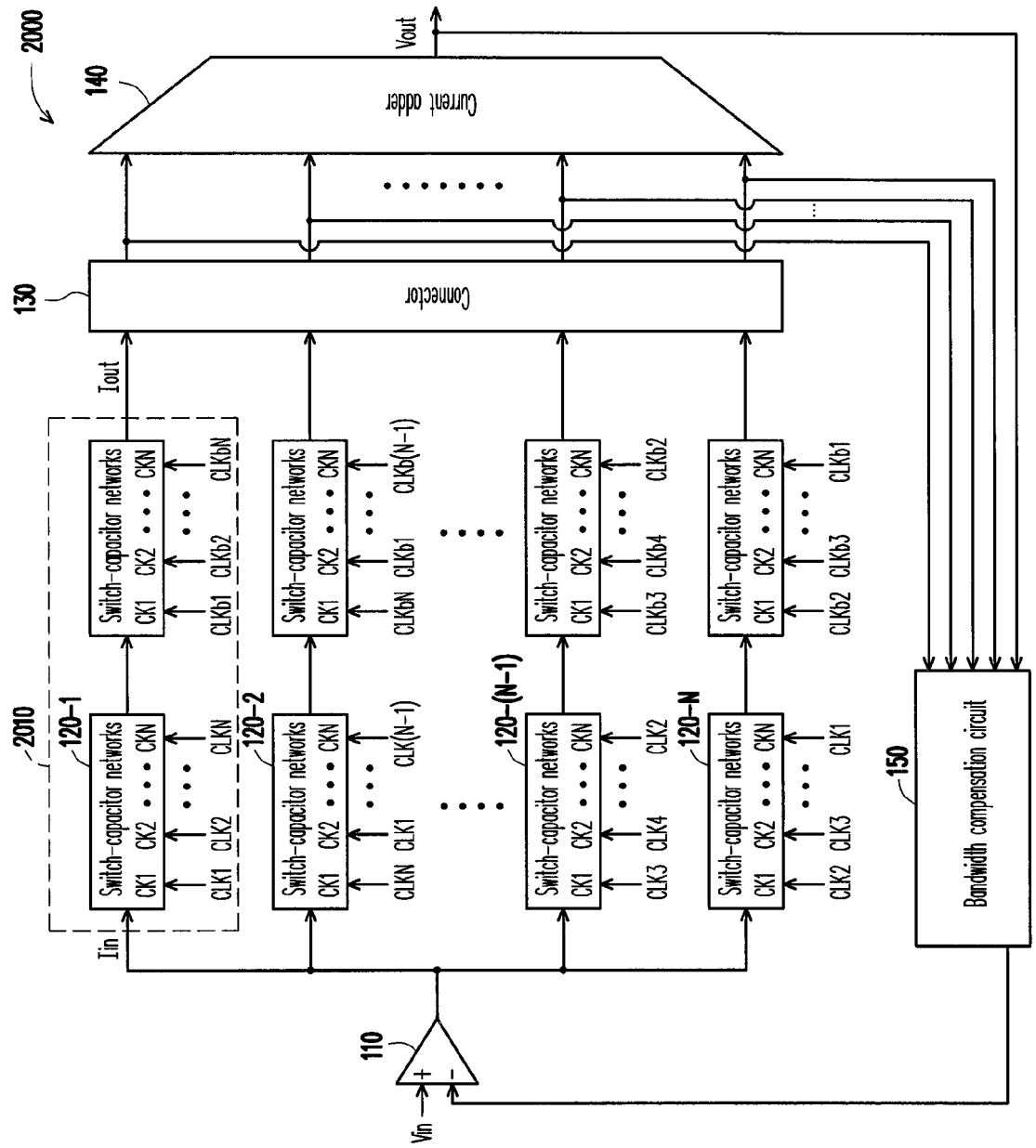

FIG. 20 is a functional block diagram of a CDF 2000 according to still another exemplary embodiment of the disclosure. Compared to the CDF 100 of FIG. 1, the CDF 200 has a plurality of SCN sets (for example, a SCN set 2010) connected in parallel. Each of the SCN sets has a plurality of SCNs (for example, the SCN 120-1) connected in series. Related description of the CDF 100 can be referred for implementation of the CDF 2000. The related description of the bandwidth compensation circuit 150 of FIGS. 1-18 can be referred for implementing the bandwidth compensation circuit 150 of FIG. 20.

Figure 21:
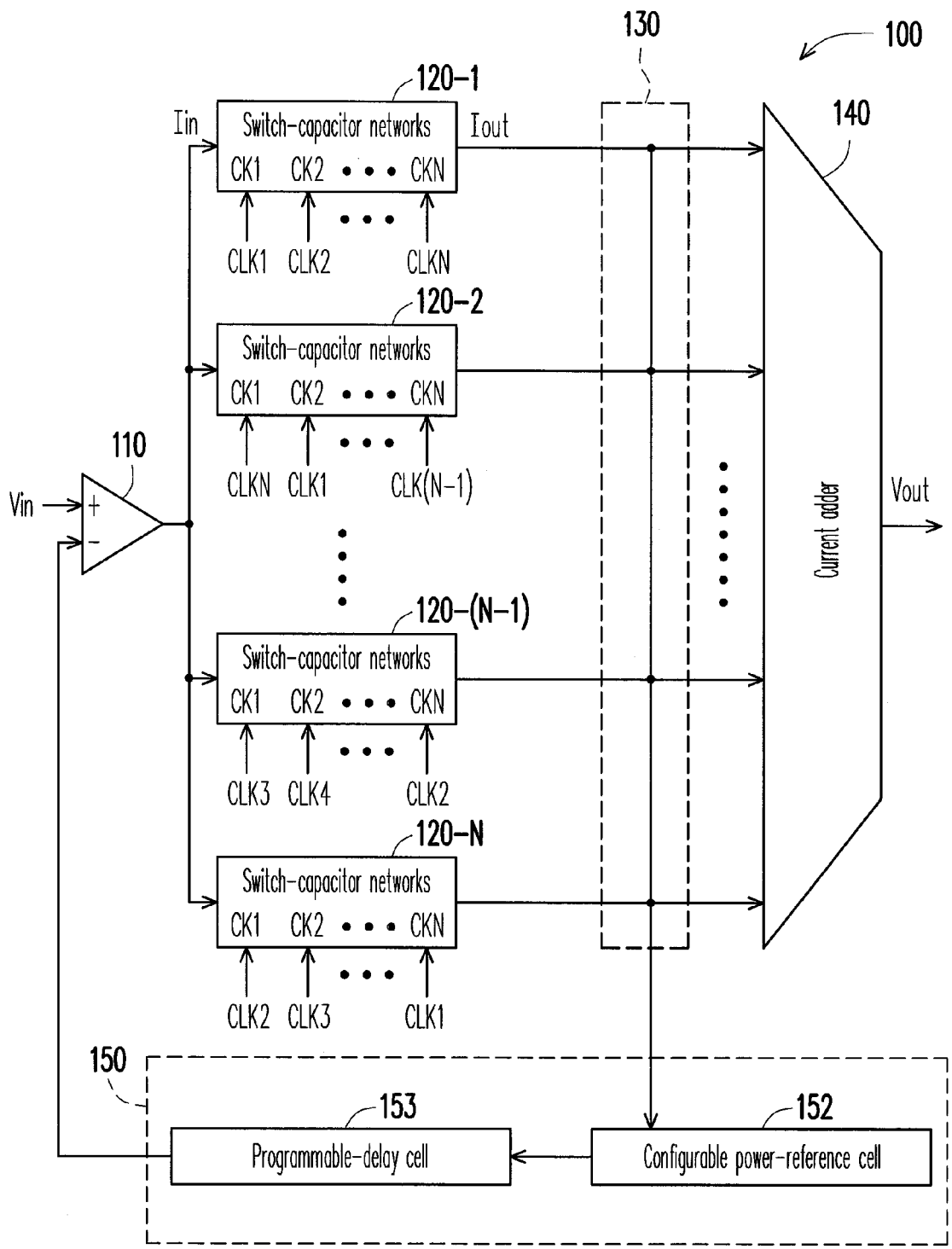
Figure 22A:
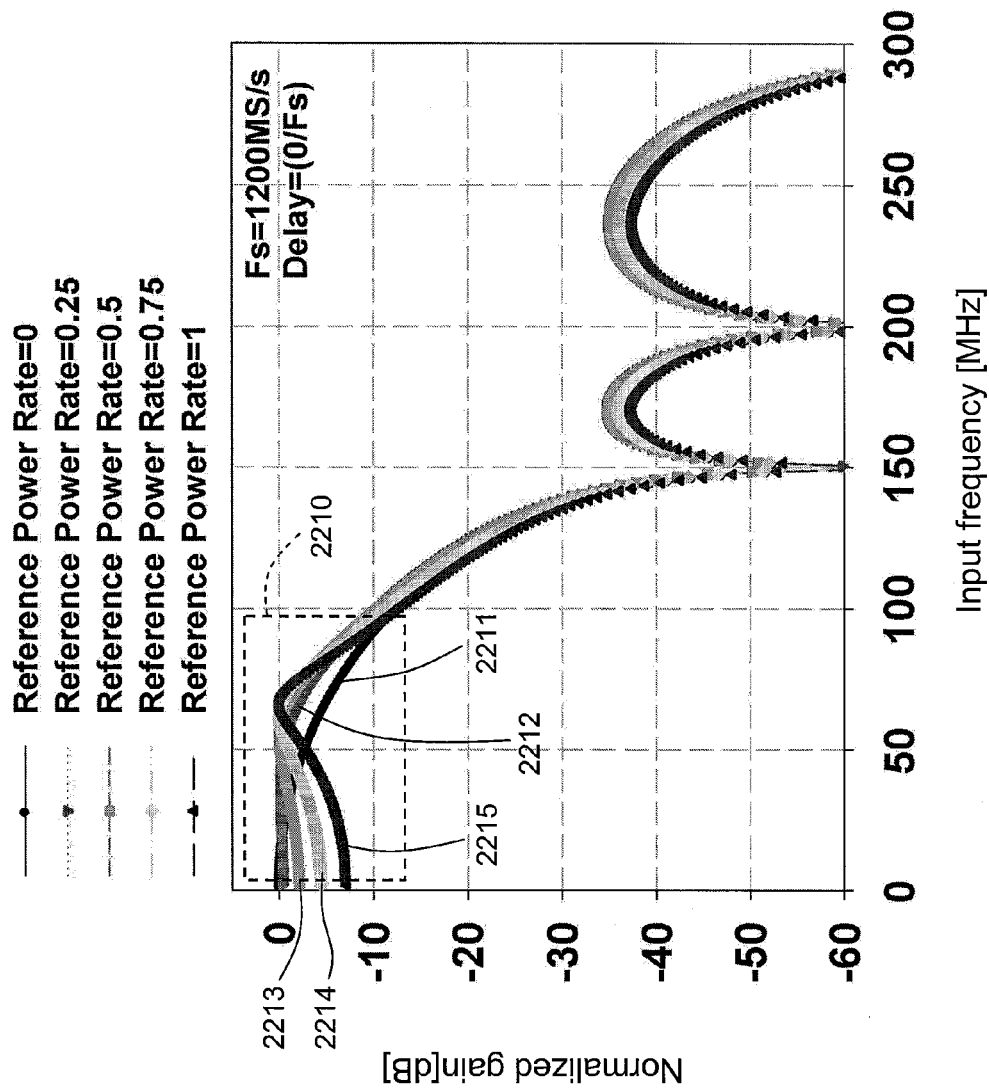
FIGS. 22A, 22B, 23A and 23B are frequency response diagrams of an output function of a CDF of FIG. 21.
Figure 22B:
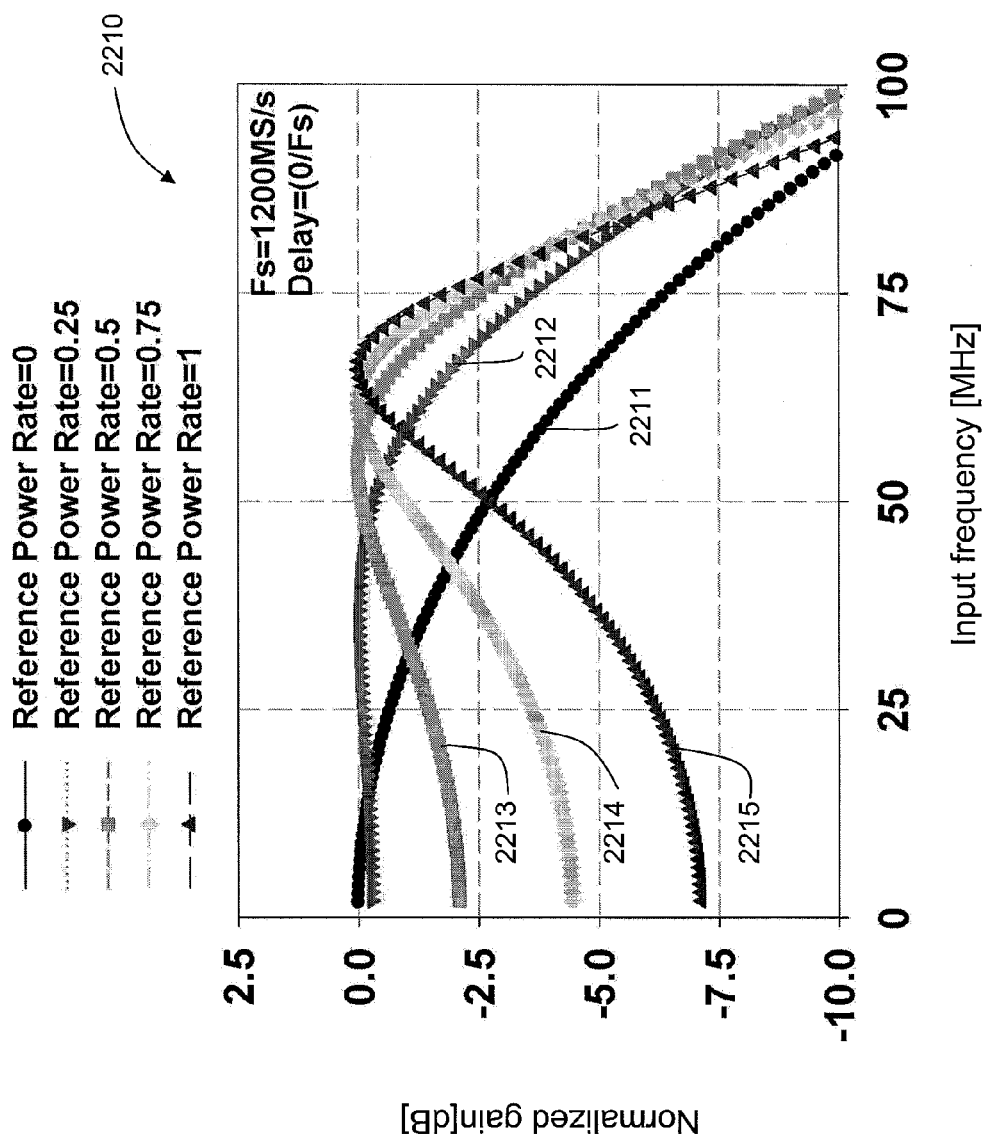

FIG. 21 is an example of the bandwidth compensation circuit 150 of FIG. 1. In the present exemplary embodiment, the connector 130 shorts the output terminals of the SCNs 120-1~120-N, and the CPC 152 of the bandwidth compensation circuit 150 only selects the output terminals of the SCNs 120-1~120-N to serve as the reference sources. FIG. 22A is a frequency response diagram of an output function of the CDF 100 of FIG. 21. FIG. 22B is an amplified diagram of a bandwidth part 2210 of FIG. 22A. In case that the delay time of the PDC 153 is set to 0 (no delay), a reference power rate of the CPC 152 is adjusted to obtain frequency response curves 2211, 2212, 2213, 2214 and 2215. If the upper divider resistor of the PDC 153 is RA, and the lower divider resistor is RB, the above reference power rate is a ratio between RA and (RA+RB). Wherein, the curve 2211 represents that the reference power rate is 0, the curve 2212 represents that the reference power rate is 0.25, the curve 2213 represents that the reference power rate is 0.5, the curve 2214 represents that the reference power rate is 0.75, and the curve 2215 represents that the reference power rate is 1. Therefore, the CPC 152 shown in FIG. 21 can achieve the Y-axis compensation (power or gain compensation) of the frequency response diagram by controlling/adjusting the source power.

Figure 23A:
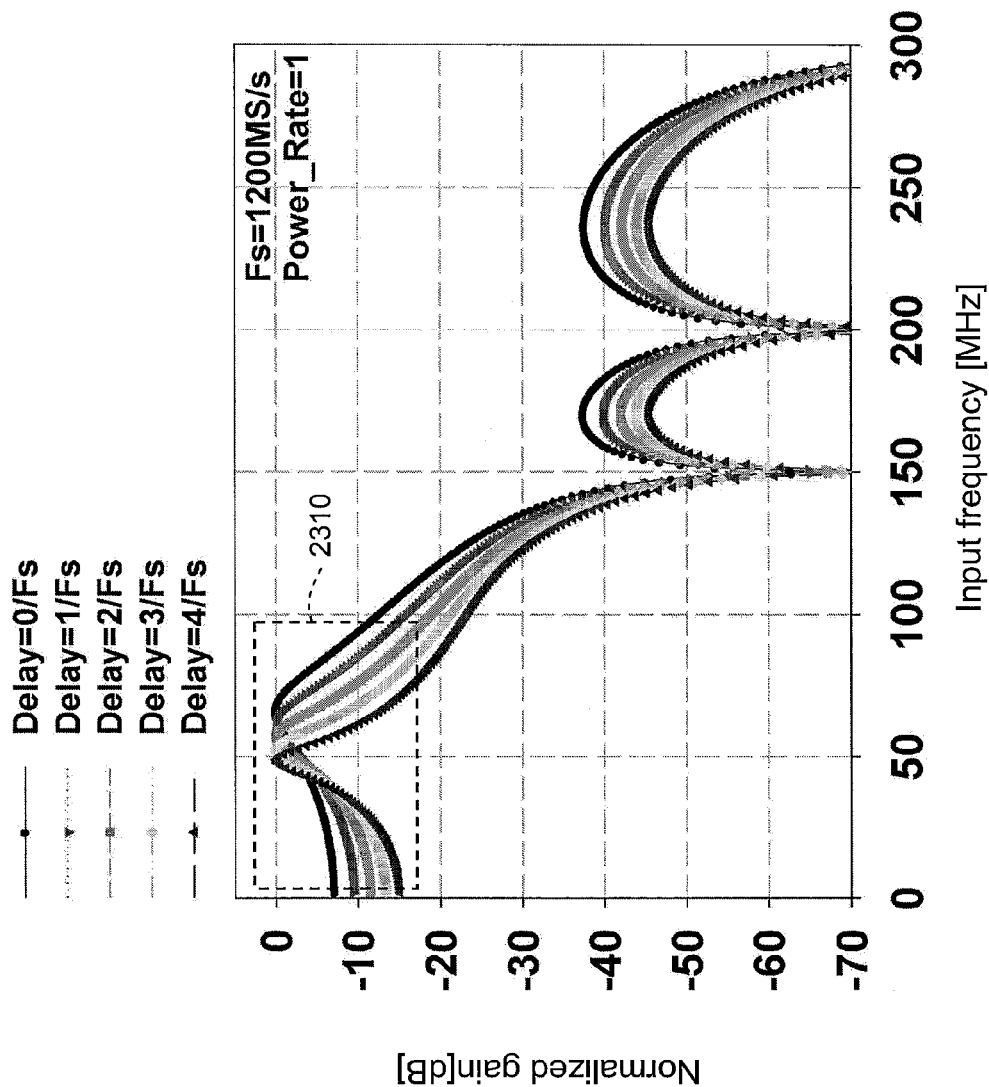
Figure 23B:
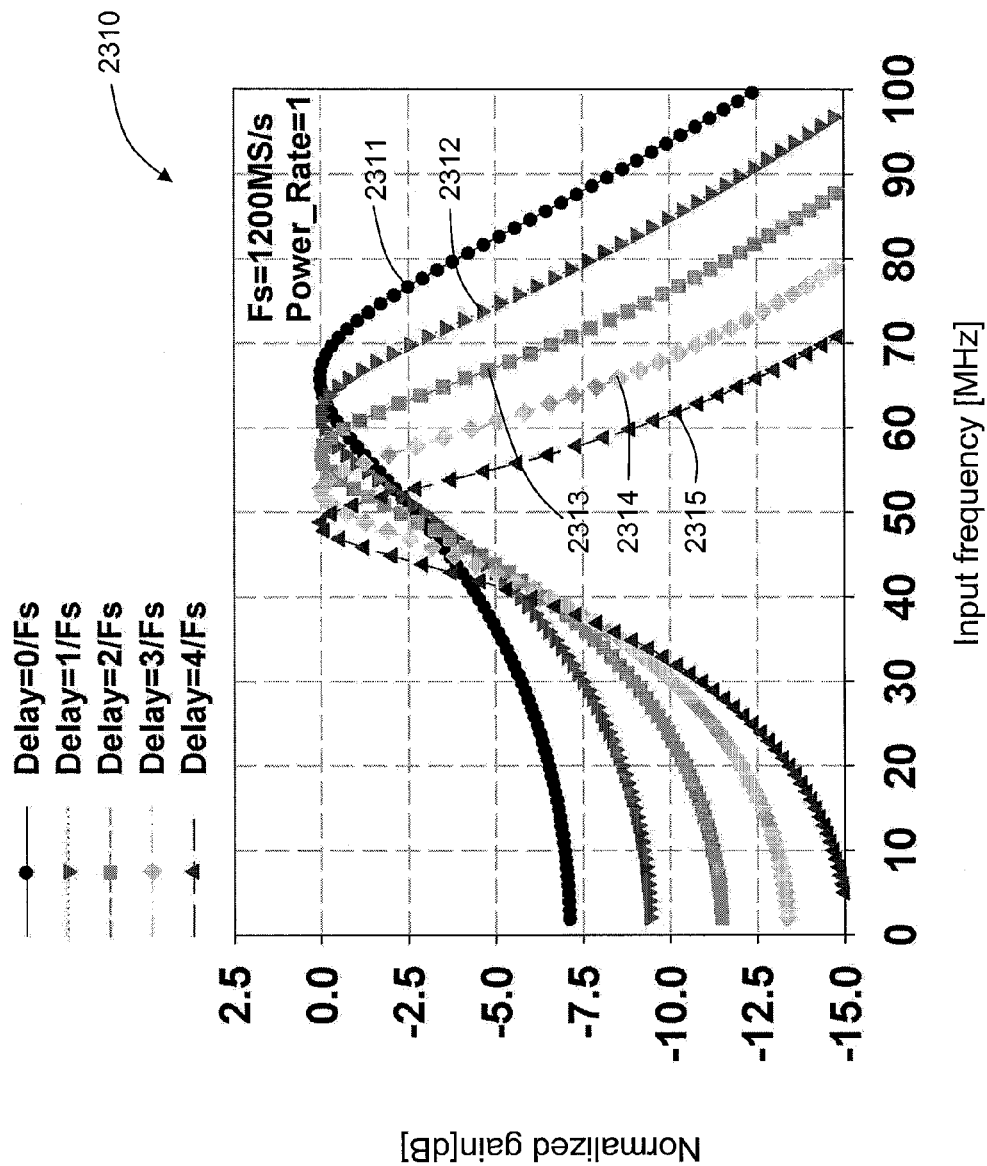

FIG. 23A is a frequency response diagram of an output function of the CDF 100 of FIG. 21. FIG. 23B is an amplified diagram of a bandwidth part 2310 of FIG. 23A. In case that the reference power rate of the CPC 152 is set to 1, the delay time of the PDC 153 is adjusted to obtain frequency response curves 2311, 2312, 2313, 2314 and 2315. Wherein, assuming sampling frequency Fs, the curve 2311 represents that the delay time is 0/Fs, the curve 2312 represents that the delay time is 1/Fs, the curve 2313 represents that the delay time is 2/Fs, the curve 2314 represents that the delay time is 3/Fs, and the curve 2315 represents that the delay time is 4/Fs. The sampling frequency Fs is determined according to design requirement of system, for example, Fs=1200 MS/s. Therefore, the PDC 153 shown in FIG. 21 can achieve the X-axis compensation (frequency compensation) of the frequency response diagram by controlling/adjusting the delay time.

Figure 24:
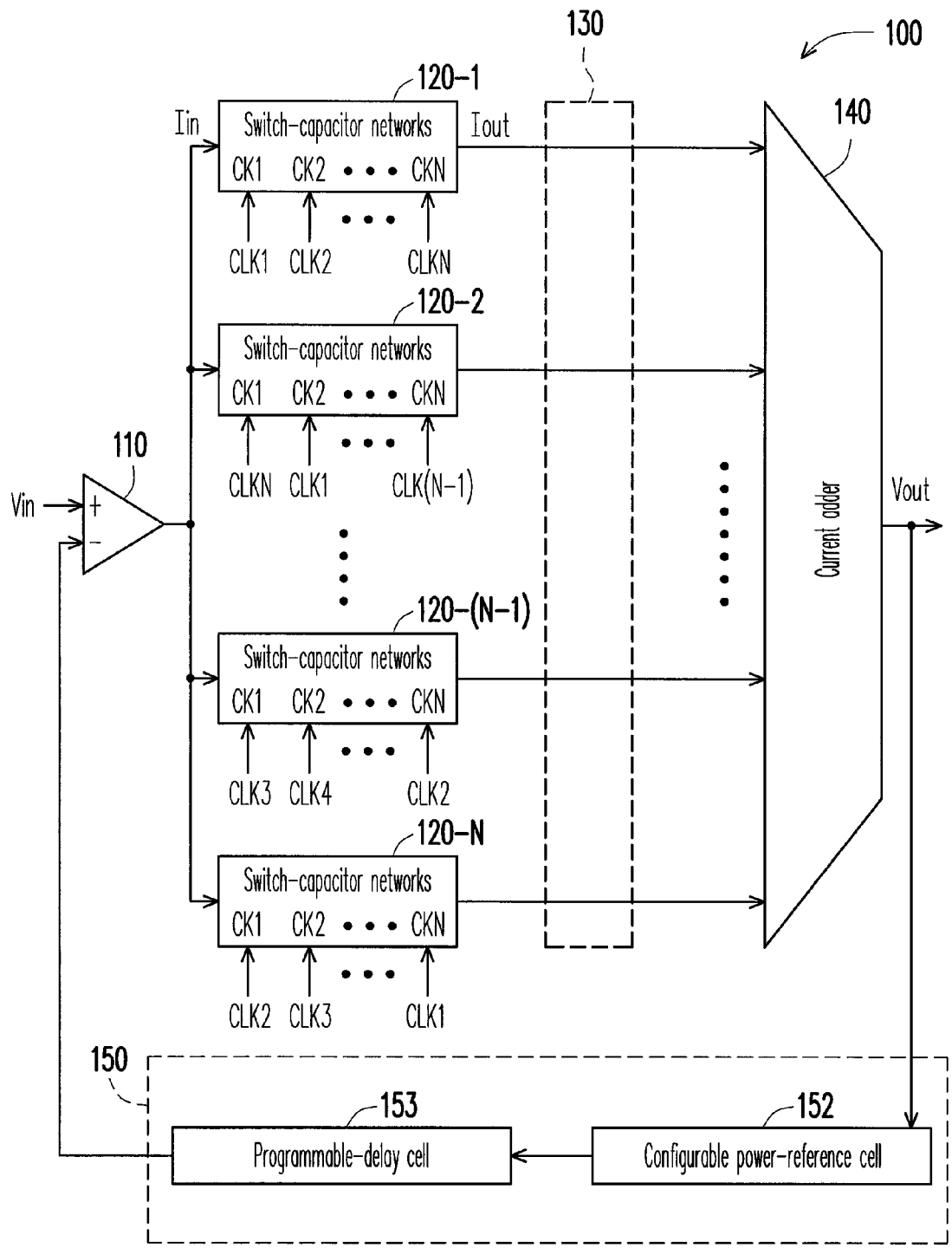
Figure 25A:
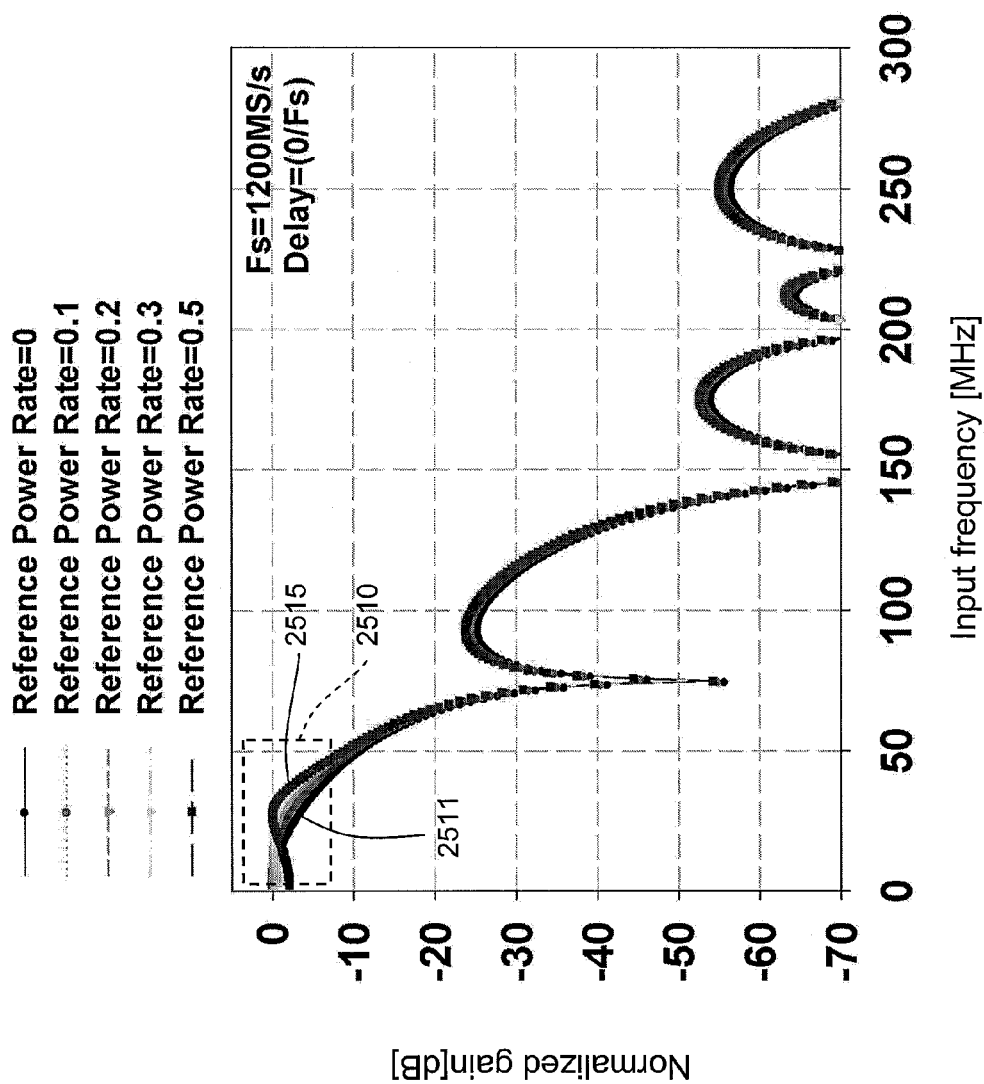
FIGS. 25A, 25B, 26A and 26B are frequency response diagrams of an output function of a CDF of FIG. 24.
Figure 25B:
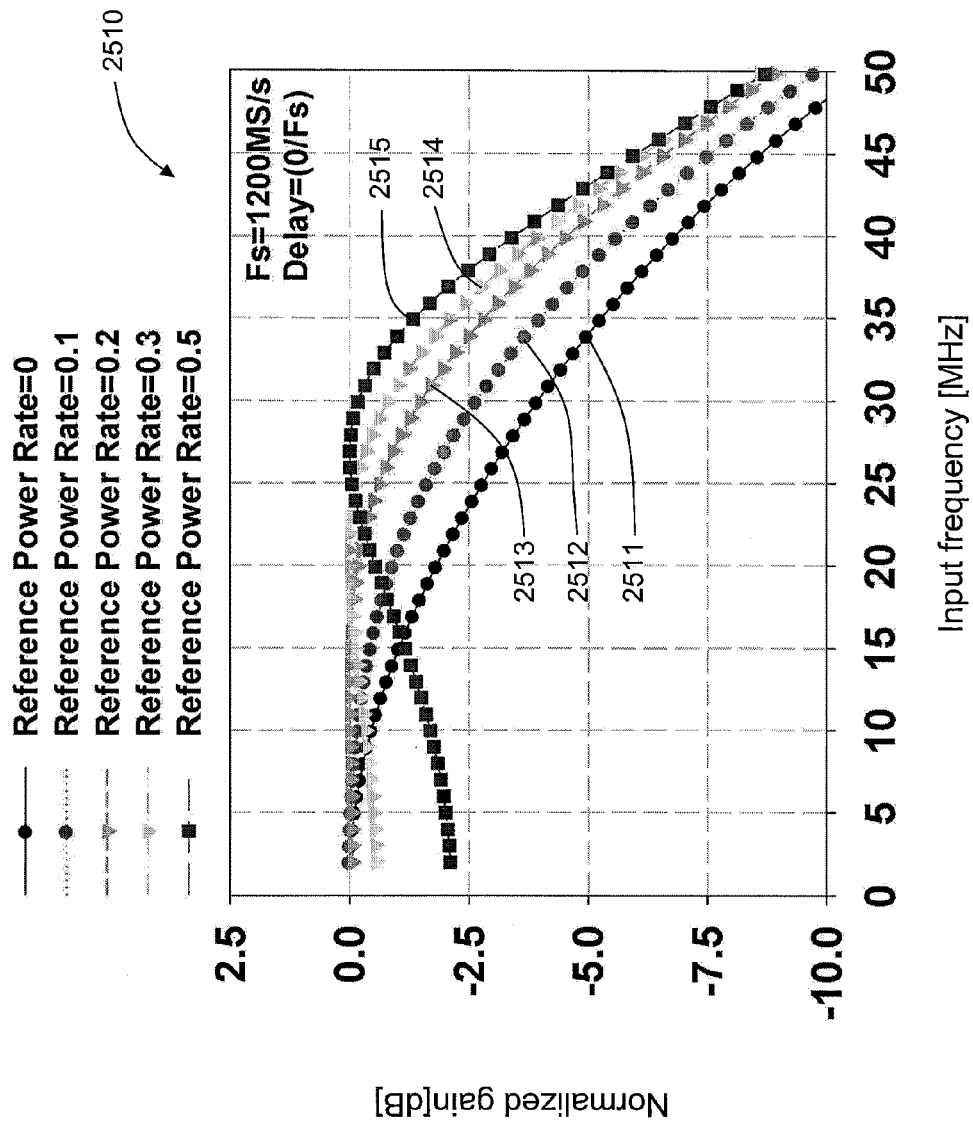

FIG. 24 is another example of the bandwidth compensation circuit 150 of FIG. 1. In the present exemplary embodiment, the connector 130 directly connects the output terminals of the SCNs 120-1~120-N to the input terminals of the CA 140, and the CPC 152 of the bandwidth compensation circuit 150 only selects the output terminal of the CA 140 as the reference source. FIG. 25A is a frequency response diagram of an output function of the CDF 100 of FIG. 24. FIG. 25B is an amplified diagram of a bandwidth part 2510 of FIG. 25A. In case that the delay time of the PDC 153 is set to 0 (no delay), a reference power rate of the CPC 152 is adjusted to obtain frequency response curves 2511, 2512, 2513, 2514 and 2515. Wherein, the curve 2511 represents that the reference power rate is 0, the curve 2512 represents that the reference power rate is 0.1, the curve 2513 represents that the reference power rate is 0.2, the curve 2514 represents that the reference power rate is 0.3, and the curve 2515 represents that the reference power rate is 0.5. Therefore, the CPC 152 shown in FIG. 24 can achieve the Y-axis compensation (power or gain compensation) of the frequency response diagram by controlling/adjusting the source power.

Figure 26A:
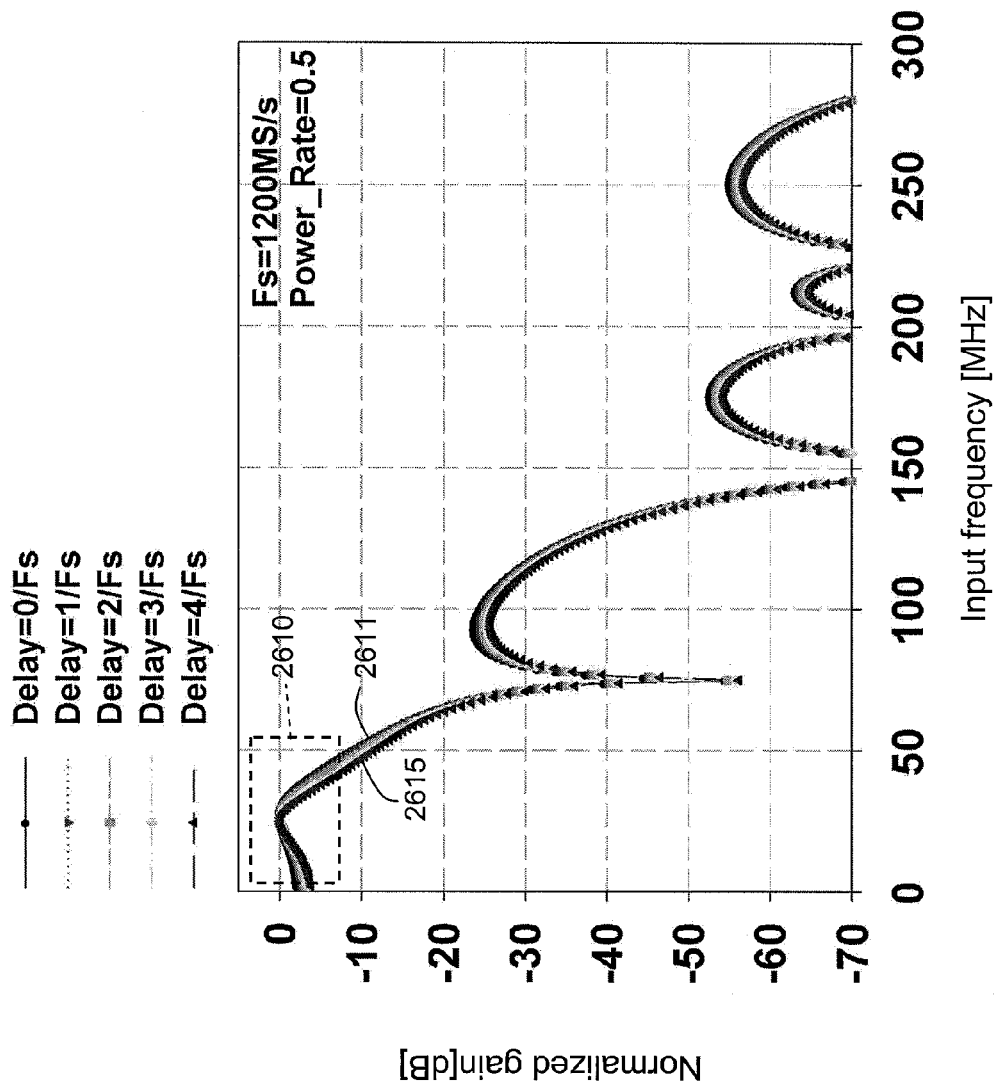
Figure 26B:
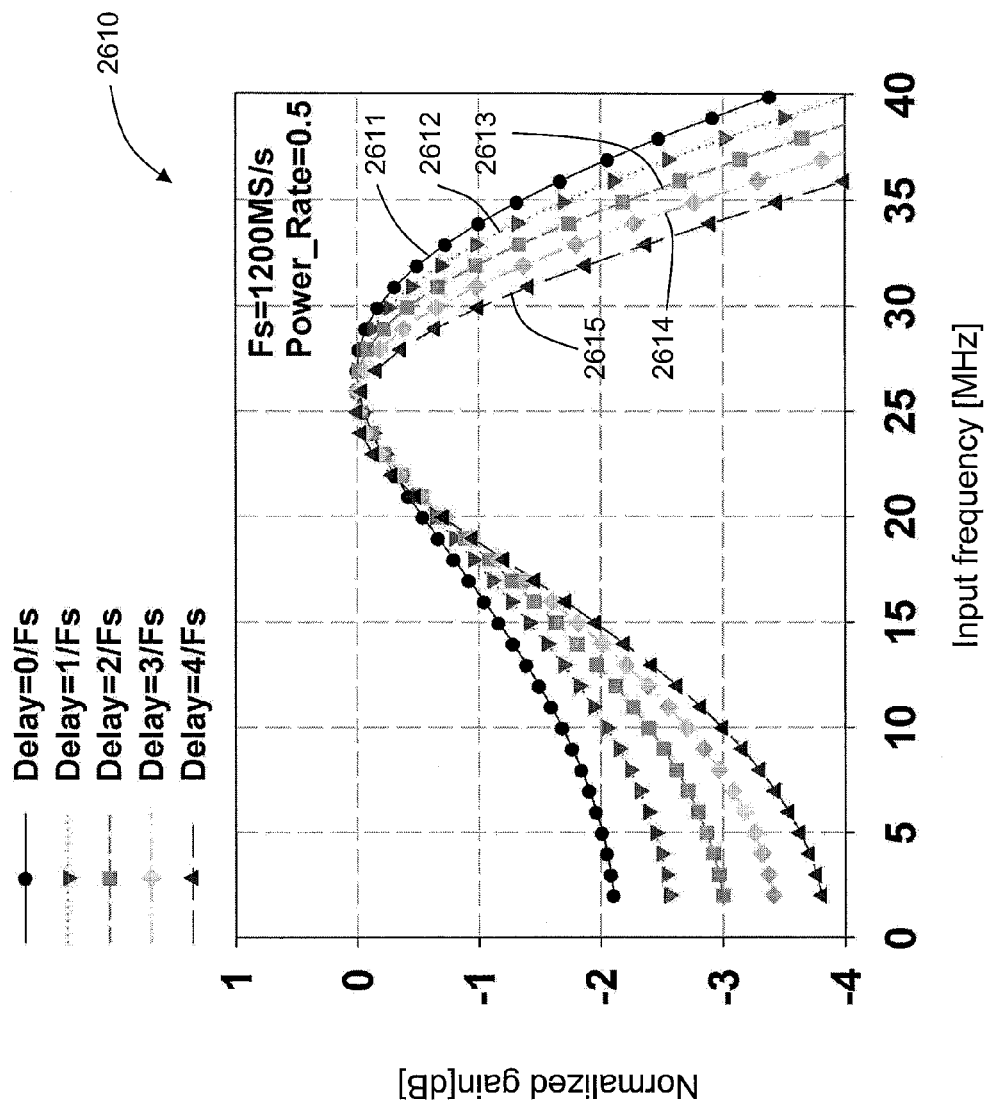

FIG. 26A is a frequency response diagram of an output function of the CDF 100 of FIG. 24. FIG. 26B is an amplified diagram of a bandwidth part 2610 of FIG. 26A. In case that the reference power rate of the CPC 152 is set to 0.5, the delay time of the PDC 153 is adjusted to obtain frequency response curves 2611, 2612, 2613, 2614 and 2615. Wherein, the curve 2611 represents that the delay time is 0/Fs, the curve 2612 represents that the delay time is 1/Fs, the curve 2613 represents that the delay time is 2/Fs, the curve 2614 represents that the delay time is 3/Fs, and the curve 2615 represents that the delay time is 4/Fs, and Fs=1200 MS/s. Therefore, the PDC 153 shown in FIG. 24 can achieve the X-axis compensation (frequency compensation) of the frequency response diagram by controlling/adjusting the delay time.

In summary, in some exemplary embodiments, the bandwidth compensation circuit 150 includes the PDC 153, the CPC 152 and the SM 151. Controlled by an external digital controller, the bandwidth compensation circuit 150 can provide a 2-D compensation of the bandwidth to the CDF. The SM 151 determines the reference sources of the CDF to the CPC 152. The reference source (related to a base band frequency from the CDF) can make the output power to reach a peak around a channel bandwidth. To avoid excessive compensation, the CPC 152 can set the sensing power. Regardless of the z-domain coefficient or the output sampling rate, the setting power of the CPC 152 can mitigate the Sinc-function distortion. Therefore, the SM 151 and the CPC 152 may achieve the Y-axis compensation. The PDC 153 suitably delays the adjusted power and feeds it back to the CDF. The PDC 153 can shift the adjusted power to a required position or frequency, and such function compensates the undesired IIR filter. The PDC 153 of the CDF can achieve the X-axis compensation. Therefore, the bandwidth compensation circuit 150 has the 2-D compensation function. The CDF using the bandwidth compensation circuit 150 may achieve the required bandwidth and mitigate the Sinc-function distortion.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A charge-domain filter (CDF) apparatus, comprising:
an amplifier, having a first input terminal receiving an input signal;
a plurality of switch-capacitor network (SCN) sets, having input terminals coupled to an output terminal of the amplifier, wherein output terminals of the SCN sets are connected to each other; and
a bandwidth compensation circuit, having input terminal coupled to the output terminals of the SCN sets, for performing power sensing to the output terminals of the SCN sets, and outputting a sensing result to a second input terminal of the amplifier.

2. The CDF apparatus as claimed in claim 1, wherein the amplifier is a transconductance amplifier, or an operation amplifier or a circuit capable of performing a signal adding operation.

3. The CDF apparatus as claimed in claim 1, wherein one of the SCN sets comprises a plurality of SCNs connected in series.

4. The CDF apparatus as claimed in claim 3, wherein one of the SCNs comprises:
   a plurality of sampling units, having sampling terminals connected to the input terminal of the SCN, wherein the sampling units respectively sample the input terminal of the SCN by different phases; and
   a summation unit, having an input terminal coupled to output terminals of the sampling units, for summing sampling results of the sampling units.

5. The CDF apparatus as claimed in claim 4, wherein one of the sampling units comprises:
   a sampling switch, having a first end coupled the input terminal of the SCN;
   a sampling capacitor, coupled to a second end of the sampling switch;
   a reset switch, having a first end coupled to the sampling capacitor, and a second end coupled to a reference voltage; and
   an output switch, having a first end coupled to the sampling capacitor, and a second end coupled to the input terminal of the summation unit.

6. The CDF apparatus as claimed in claim 4, wherein the summation unit comprises:
   a summation capacitor, coupled to the output terminals of the sampling unit.

7. The CDF apparatus as claimed in claim 6, wherein the summation unit further comprises:
   a first switch, having a first end coupled to the output terminals of the sampling units; and
   a first capacitor, coupled to a second end of the first switch.

8. The CDF apparatus as claimed in claim 6, wherein the summation unit further comprises:
   a second switch, having a first end coupled to the summation capacitor; and
   a third switch, having a first end coupled to a second end of the second switch, and a second end coupled to a reference voltage.

9. The CDF apparatus as claimed in claim 1, further comprising:
   a current adder (CA), having input terminals coupled to the output terminals of the SCN sets.

10. The CDF apparatus as claimed in claim 9, wherein the CA performs a summation operation to corresponding currents of charges.

11. The CDF apparatus as claimed in claim 1, wherein the bandwidth compensation circuit comprises:
    a configurable power-reference cell (CPC), for adjusting the outputs of the SCN sets to obtain a sensing power, and outputting the sensing power as the sensing result to the second input terminal of the amplifier.

12. The CDF apparatus as claimed in claim 11, wherein the CPC comprises:
    an upper divider resistor, having a first end serving as an input terminal of the CPC, and a second end serving as an output terminal of the CPC; and
    a plurality of lower divider resistor units, respectively comprising:
        a lower divider resistor, having a first end coupled to the second end of the upper divider resistor; and
        a fourth switch, having a first end coupled to a second end of the lower divider resistor, and a second end coupled to a reference voltage.

13. The CDF apparatus as claimed in claim 1, wherein the bandwidth compensation circuit comprises:
    a programmable-delay cell (PDC), delaying the outputs of the SCN sets, and outputting a delay result as the sensing result to the second input terminal of the amplifier.

14. The CDF apparatus as claimed in claim 13, wherein the PDC comprises:
    an equivalent reference resistor, having a first end coupled to an input terminal of the PDC, and a second end coupled to an output terminal of the PDC; and
    a plurality of delay units, respectively comprising:
        a delay capacitor, having a first end coupled to the second end of the equivalent reference resistor; and
        a delay switch, having a first end coupled to a second end of the delay capacitor, and a second end coupled to a reference voltage.

15. The CDF apparatus as claimed in claim 1, wherein the bandwidth compensation circuit comprises:
    a configurable power-reference cell (CPC), having an input terminal coupled to the output terminals of the SCNs, wherein the CPC adjusts the output terminals of the SCNs to serve as at least one sensing power; and
    a programmable-delay cell (PDC), having an input terminal coupled to an output terminal of the CPC, for delaying the sensing power, and outputting the delayed sensing power as the sensing result to the second input terminal of the amplifier.

* * * * *